United States Patent
Choi

(10) Patent No.: US 7,602,642 B2
(45) Date of Patent: Oct. 13, 2009

(54) NONVOLATILE MEMORY SYSTEM AND ASSOCIATED PROGRAMMING METHODS

(75) Inventor: Jin-Hyeok Choi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 189 days.

(21) Appl. No.: 11/730,322

(22) Filed: Mar. 30, 2007

(65) Prior Publication Data

US 2008/0094893 A1   Apr. 24, 2008

(30) Foreign Application Priority Data

Oct. 19, 2006   (KR) .................. 10-2006-0101954

(51) Int. Cl.
*G11C 11/34* (2006.01)
(52) U.S. Cl. .................. 365/185.09; 365/200
(58) Field of Classification Search ............ 365/185.09, 365/200
See application file for complete search history.

(56) References Cited

U.S. PATENT DOCUMENTS

| | | | |
|---|---|---|---|
| 6,119,251 A * | 9/2000 | Cloud et al. ................ 714/718 |
| 6,532,556 B1 * | 3/2003 | Wong et al. ................ 714/702 |
| 6,608,784 B2 | 8/2003 | Kanamori et al. |
| 6,839,875 B2 * | 1/2005 | Roohparvar ................ 714/773 |
| 7,017,099 B2 * | 3/2006 | Micheloni et al. ........... 714/752 |
| 7,096,406 B2 * | 8/2006 | Kanazawa et al. .......... 714/763 |
| 7,213,191 B2 * | 5/2007 | Chao ........................ 714/758 |
| 2005/0044459 A1 * | 2/2005 | Scheuerlein et al. ........ 714/719 |
| 2005/0286297 A1 * | 12/2005 | Roohparvar ........... 365/185.03 |
| 2006/0039196 A1 * | 2/2006 | Gorobets et al. ....... 365/185.01 |
| 2006/0126394 A1 | 6/2006 | Li |
| 2006/0179377 A1 * | 8/2006 | Dawson et al. .............. 714/733 |

FOREIGN PATENT DOCUMENTS

| | | |
|---|---|---|
| JP | 2002334586 A | 11/2002 |
| JP | 2004-220068 | 8/2004 |
| KR | 1020000048015 A | 7/2000 |
| KR | 1020020057055 A | 7/2002 |
| KR | 1020050007653 A | 1/2005 |
| KR | 1020060107689 A | 10/2006 |

* cited by examiner

*Primary Examiner*—Michael T Tran
(74) *Attorney, Agent, or Firm*—Volentine & Whitt, PLLC

(57) ABSTRACT

A nonvolatile memory system includes a host system, a memory controller, and a flash memory chip including multi-level flash memory cells. The memory controller includes a backup memory adapted to store a backup copy of previously programmed data from the multi-level flash memory cells when further programming of the multi-level flash memory cells fails. The backup copy of the previously programmed data is used to detect and correct any errors in the previously programmed data before reprogramming the previously programmed data to different multi-level memory cells in the nonvolatile memory system.

31 Claims, 14 Drawing Sheets

NONVOLATILE MEMORY SYSTEM AND ASSOCIATED PROGRAMMING METHODS

CROSS REFERENCE TO RELATED APPLICATION

This application claims priority to Korean Patent Application No. 10-2006-0101954 filed Oct. 19, 2006, the subject matter of which is hereby incorporated by reference.

BACKGROUND OF THE INVENTION

1. Field of the Invention

Embodiments of the invention relate generally to nonvolatile semiconductor memory systems. More particularly, embodiments of the invention relate to nonvolatile semiconductor memory systems including multi-level nonvolatile memory cells and methods for programming the multi-level nonvolatile memory cells.

2. Description of Related Art

Nonvolatile memory systems are commonly employed in a wide variety of consumer and industrial electronic applications. Common examples of such applications include cellular telephones, personal digital assistants (PDAs), MP3 players, digital cameras, portable disk drives, portable media players (PMPs), and auxiliary memories such as the basic input/output system (BIOS) for personal computers, to name but a few.

Due to the widespread use of nonvolatile memory systems, there continues to be an increasing demand for nonvolatile memory systems having higher data storage capacity and higher overall performance. As a result, researchers are continually striving to find new ways to store more data per memory chip unit area within nonvolatile memory systems.

The use of multi-level nonvolatile memory cells is one technique that has been adopted to increase the amount of stored data per unit memory chip area in nonvolatile memory systems. A multi-level nonvolatile memory cell is a capable of storing more than one bit of data. Accordingly, multi-level nonvolatile memory cells are often interchangeably referred to as multi-bit nonvolatile memory cells.

A typical example of a multi-level nonvolatile memory cell is a multi-level flash memory cell. In general, flash memory cells store data in relation to distinct threshold voltage distributions. In other words, when a different data value is programmed within a flash memory cell, the threshold voltage of the flash memory cell changes from within one threshold voltage distribution to within another threshold voltage distribution.

For instance, figure (FIG.) 1 illustrates two distinct threshold voltage distributions used to store data in a single-level flash memory cell. In the example of FIG. 1, where the single-level flash memory cell has a threshold voltage within a threshold voltage distribution labeled "1", the single-level flash memory cell stores a logical "1". Otherwise, where the single-level flash memory cell has a threshold voltage within a threshold voltage distribution labeled "0", the single-level flash memory cell stores a logical "0". Accordingly, the logic state of a single bit stored in the single-level flash memory cell can be determined by applying a read voltage Vread to a control gate of the single-level flash memory cell and determining whether the threshold voltage of the single-level flash memory cell is above or below read voltage Vread, e.g., by detecting an amount of current flowing through the memory cell while read voltage Vread is applied to the control gate.

In general, where a memory cell has a threshold voltage within a particular threshold voltage distribution, the memory cell can be said to have a "threshold voltage state" corresponding to a logic state represented by the threshold voltage distribution.

FIG. 2 illustrates four distinct threshold voltage distributions used to store data in a multi-level flash memory cell. In particular, the multi-level flash memory cell of FIG. 2 is capable of storing two bits of data, as indicated by the labels on the four threshold voltage distributions. In other words, where the multi-level flash memory cell of FIG. 2 has a threshold voltage within a threshold voltage distribution labeled "11", the multi-level flash memory cell stores a logical "11" (i.e., most significant bit (MSB) "1" and least significant bit (LSB) "1"), where the multi-level flash memory cell has a threshold voltage within a threshold voltage distribution labeled "10", the multi-level flash memory cell stores a logical "10", where the multi-level flash memory cell has a threshold voltage within a threshold voltage distribution labeled "01", the multi-level flash memory cell stores a logical "01", and where the multi-level flash memory cell has a threshold voltage within a threshold voltage distribution labeled "00", the multi-level flash memory cell stores a logical "00". The logic state of the multi-level flash memory cell illustrated in FIG. 2 can be determined by variously applying read voltages Vread1, Vread2, and Vread3 to a control gate of the multi-level flash memory cell and determining the magnitude of the threshold voltage of the multi-level flash memory cell relative to these read voltages.

FIG. 3 illustrates an exemplary nonvolatile memory system including a flash memory comprising multi-level flash memory cells.

Referring to FIG. 3, an exemplary nonvolatile memory system 100 comprises a host 110, a memory controller 120, and a flash memory 130. Among other things, memory controller 120 comprises a buffer memory 121 and flash memory 130 comprises a memory cell array 131 and a page buffer 132.

In memory controller 120, buffer memory 121 temporarily stores data to be programmed in flash memory 130 during program operations, and data read from flash memory 130 during read operations. Buffer memory 121 operates under the control of memory controller 120 and transfers data from host 110 and to flash memory 130 during program operations, and transfers data from flash memory 130 and to host 110 during read operations.

In flash memory 130, memory cell array 131 stores programmed data. Page buffer 132 temporarily stores data to be programmed in memory cell array 131 in program operations and data read from memory cell array 131 in read operations. Memory cell array 131 comprises a plurality of multi-bit nonvolatile memory cells arranged in rows and columns. As an example, cell array 131 may comprise a NAND flash memory array including NAND flash memory cells arranged in a plurality of NAND strings. Typically, the columns of memory cell array 131 are connected to corresponding bit-lines and the rows are connected to corresponding wordlines.

Each row of multi-bit nonvolatile memory cells connected to the same wordline in memory cell array 131 corresponds to one or more pages of data storage. Typically, though not necessarily, programming and read operations are performed on memory cell array 131 one page at a time. As an example, a page of data to be programmed in memory cell array 131 is first transferred to page buffer 132. Then, appropriate voltages are applied to a wordline and bitlines corresponding to a row of memory cells to be programmed in memory cell array 131 based on the page of data stored in page buffer 132.

Where the memory cells in the row are multi-bit memory cells, each row of nonvolatile memory cells connected to the same wordline in memory cell array 131 will correspond to more than one page of data storage. For instance, a row of 2-bit nonvolatile memory cells will correspond to two pages of data. In particular, the two pages, which can be independently programmed, correspond to a least significant bit (LSB) page and a most significant bit (MSB) page because they correspond to LSB and MSB data of the respective 2-bit memory cells, respectively.

In a program operation of nonvolatile memory system 100, host 110 sends a program command and associated program data to memory controller 120. Memory controller 120 receives the program command and the program data and stores the program data in buffer memory 121. In response to the program command, memory controller 120 then controls flash memory 130 to load the program data from buffer memory 121 into page buffer 132. Memory controller 120 then further controls flash memory 130 to program the program data into selected memory cells of memory cell array 131. The location of the selected memory cells in memory cell array 131 where the program data is programmed is typically specified by a program address provided to memory controller 120 by host 110 together with the program command. Usually, flash memory 130 includes row and column decoders that can be used to select appropriate bitlines and wordlines in memory cell array 131 for the program operation based on the program address.

In a read operation of nonvolatile memory system 100, host 110 sends a read command to memory controller 120. In response to the read command, memory controller 120 controls flash memory 130 to transfer read data stored in selected memory cells of memory cell array 131 to page buffer 132. Memory controller 120 then further controls flash memory 130 to transfer the read data from page buffer 132 to buffer memory 121. Finally, memory controller 120 controls buffer memory 121 to transfer the read data from buffer memory 121 to host 110. Similar to the program operation, the location of the selected memory cells of memory cell array 131 in the read operation is typically specified by a read address provided to memory controller 120 by host 110 together with the read command. Likewise, flash memory 130 generally uses row and column decoders to select appropriate bitlines and wordlines of memory cell 131 for the read operation based on the read address.

Following a program operation, memory controller 120 typically controls flash memory 130 to perform a program-verify operation. The program-verify operation is similar to a read operation, except that the purpose of the program-verify operation is to determine whether selected memory cells have been successfully programmed. In the program-verify operation, program-verify data is transferred from selected memory cells that were programmed in the program operation, to page buffer 132. Page buffer 132 temporarily stores the program-verify data and the program verify data is compared to program data still stored in buffer memory 121. Where the program data stored in buffer memory 121 is not the same as the program-verify data in page buffer 132, the selected memory cells have not been successfully programmed. Otherwise, where the program data stored in buffer memory 121 is the same as the program-verify data in page buffer 132, the selected memory cells have been successfully programmed. Where the selected memory cells have not been successfully programmed, these memory cells are then either re-programmed with the program data stored in buffer memory 121 or the program data is programmed in a new location of memory cell array 131, such as a different page or a different block.

FIGS. 4 and 5 illustrate different methods that can be used to program a nonvolatile memory system such as that illustrated in FIG. 3. In particular, the methods of FIGS. 4 and 5 are examples of methods for programming nonvolatile memory systems including 2-bit memory cells. In these and other examples, the correspondence between logic states and threshold voltages can be rearranged. For instance, in FIGS. 4 and 5, logic states are assigned to threshold voltages in a non-gray-coded and gray-coded order, respectively. In addition, the order in which respective bits are programmed can also be varied. For instance, although FIGS. 4 and 5 illustrate programming a LSB before programming a MSB, a MSB could alternatively be programmed before the LSB. Moreover, a variety of other programming variations are known in the art and will therefore not be described in detail.

Referring to FIG. 4, a programmed state of a multi-bit nonvolatile memory cell is characterized in relation to five different threshold voltage distributions. Four of these five threshold voltage distributions correspond to respective logic states "11", "01", "10", and "00", and one threshold voltage distribution corresponds to an intermediate programming state or threshold voltage state, denoted by a dotted arc and overlapping a read voltage VR2 of the multi-bit nonvolatile memory cell. In this example, logic state "11" corresponds to an erased state of the multi-bit nonvolatile memory cell, while logic states "01", "10", and "00" correspond to programmed states of the multi-bit nonvolatile memory cell.

In the method illustrated in FIG. 4, the memory cell is initially in the erased state. From the erased state, a LSB of the memory cell is programmed first, followed by a MSB of the memory cell. In programming the LSB, if the LSB to be programmed in the memory cell is a logical "0", the method changes the memory cell from logic state "11" to the intermediate programming state, as indicated by an arrow labeled "Program0". Otherwise, the memory cell remains in logic state "11". Next in programming the MSB, if the MSB to be programmed in the memory cell is a logical "0", the method changes the memory cell from the intermediate programming state to logic state "00" as indicated by an arrow labeled "Program1", or from logic state "11" to logic state "01" as indicated by an arrow labeled "Program3", depending on the logic state of the LSB. Otherwise, where the MSB to be programmed in the memory cell is a logical "1", the method changes the memory cell from the intermediate programming state to logic state "10" as indicated by an arrow labeled "Program2", or maintains the memory cell in logic state "11", depending on the logic state of the LSB.

Referring to FIG. 5, a programmed state of a multi-bit nonvolatile memory cell is characterized in relation to four different threshold voltage distributions. The four threshold voltage distributions correspond to respective logic states "11", "10", "00", and "01". In this example, logic state "11" corresponds to an erased state of the multi-bit nonvolatile memory cell, and logic states "10", "00", and "01" correspond to programmed states of the multi-bit nonvolatile memory cell.

In the method illustrated in FIG. 5, the memory cell is initially in the erased state. From the erased state, a LSB of the memory cell is programmed first, followed by a MSB of the memory cell. In programming the LSB, if the LSB to be programmed in the memory cell is a logical "0", the method changes the memory cell from logic state "11" to logic state "10" as indicated by an arrow labeled "Program1". Otherwise, the memory cell remains in logic state "11". Next in programming the MSB, if the MSB to be programmed in the memory cell is a logical "0", the method changes the memory cell from logic state "10" to logic state "00" as indicated by an arrow labeled "Program2", or from logic state "11" to logic state "01" as indicated by an arrow labeled "Program3", depending on the logic state of the LSB. Otherwise, if the MSB to be programmed in the memory cell is a logical "1", the memory cell remains in logic state "10" or logic state "11", depending on the logic state of the LSB.

In general, when the programming methods illustrated in FIGS. 4 and 5 are performed, the LSB and the MSB of the memory cell will not always be programmed in immediate succession. Instead, for example, the LSB of the memory cell may be programmed first, followed by program operations for memory cells in different rows of the memory cell array, and then the MSB of the memory cell may be programmed next. Accordingly, the logic state of the LSB must generally be ascertained, e.g., by reading the memory cell, before the MSB of the memory cell can be programmed so that the threshold voltage of the memory cell can be changed to within the correct threshold voltage distribution.

Unfortunately, however, if an error or malfunction occurs during programming of the MSB, the LSB may be permanently lost. For instance, if MSB programming is performed on the memory cell as indicated by the arrow labeled "Program3" in FIG. 5 and the MSB programming stops short of threshold voltage distribution corresponding to logic state "01", it may be impossible to determine, based on a simple inspection of the memory cell, whether the LSB of the memory cell was a logical "1" or a logical "0". Fortunately, in such cases, the MSB data can generally be recovered from buffer memory 121. However, the loss of the LSB data may ultimately cripple the performance of nonvolatile memory system.

This problem becomes increasingly important as researchers continue striving to fit more and more data storage capacity within a limited chip area of nonvolatile memory devices, because as the integration density of nonvolatile memory chips increases, the likelihood of errors and malfunctions in program operations tends to increase accordingly. As a result, it would be beneficial to effectively address problems such as the above described data loss problem in multi-level cells caused by programming errors or malfunctions.

SUMMARY OF THE INVENTION

In recognition of at least the above described problems, selected embodiments of the invention provide nonvolatile memory systems and methods adapted to prevent data from being lost due to programming errors or malfunctions.

According to one embodiment of the invention, a nonvolatile semiconductor memory system comprises a memory array and a memory controller. The memory array comprises a plurality of multi-bit memory cells. The memory controller comprises a buffer memory, a repair memory, a fail position detector, and a repair unit. The buffer memory is adapted to store j-bit data programmed in selected memory cells among the plurality of memory cells. The repair memory is adapted to store i-bit data read from the selected memory cells. The fail position detector is adapted to determine the location of a bit error in the i-bit data based on a comparison between j-bit data read from the selected memory cells and the j-bit data stored in the buffer memory. The repair unit is adapted to repair bit errors in the i-bit data stored in the repair memory.

According to another embodiment of the invention, a nonvolatile semiconductor memory system comprises first through n-th memory chips and a memory controller. Each of the first through n-th memory chips comprises a plurality of multi-bit nonvolatile memory cells. The memory controller comprises first through m-th buffer memories each adapted to store j-bit data programmed in selected memory cells among the plurality of multi-bit nonvolatile memory cells in the first through n-th memory chips. The memory controller further comprises first through p-th repair memories adapted to store i-bit data stored in the selected memory cells. The memory controller still further comprises a fail position detector adapted to determine the location of a bit error in the i-bit data based on a comparison between j-bit data read from the selected memory cells and the j-bit data stored in the buffer memory. The memory controller still further comprises a repair unit adapted to repair bit errors in the i-bit data stored in the repair memory.

According to yet another embodiment of the invention, a method of performing a program operation in a multi-bit nonvolatile semiconductor is provided. The multi-bit nonvolatile memory system comprises a memory array including a plurality of multi-bit memory cells, and a memory controller. The method comprises programming i-bit data in selected memory cells of the memory array, storing j-bit data in the memory controller, programming the j-bit data in the selected memory cells, determining whether the j-bit data was successfully programmed in the selected memory cells, upon determining that the j-bit data was not successfully programmed in the selected memory cells, and comparing the j-bit data stored in the selected memory cells with the j-bit data stored in the memory controller. Based on the comparison, the position of at least one bit error in the i-bit data stored in the selected memory cells is determined, and the at least one bit error is then repaired.

According to still another embodiment of the invention, another method of programming a nonvolatile memory is provided. The nonvolatile memory comprises multi-bit nonvolatile memory cells, and the method comprises defining a cell scramble for the memory cells, and upon detecting a programming failure for j-bit data in a selected one of the memory cells, repairing previously programmed i-bit data in the selected memory cell in relation to the cell scramble.

BRIEF DESCRIPTION OF THE DRAWINGS

Embodiments of the invention are described in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

In general, embodiments of the invention provide nonvolatile memory systems and associated methods adapted to prevent data already stored in multi-bit nonvolatile memory cells from being lost when the multi-bit nonvolatile memory cells are further programmed. For example, selected embodiments of the invention provide a memory controller including a backup memory and/or data repair elements used to prevent the loss of data already stored in the multi-bit nonvolatile memory cells when the memory cells are further programmed. Still other embodiments of the invention provide a memory controller including a repair memory adapted to store data already programmed in the multi-bit nonvolatile memory cells for purposes of repairing the data after a programming failure of the memory cells has been detected.

Selected embodiments of the invention are described below in relation to nonvolatile memory systems including 2-bit memory cells. However, these embodiments could be readily modified to function with nonvolatile memory systems including n-bit cells, where "n" is an integer greater than 2. In addition, in several disclosed embodiments, a least significant bit of memory cells is programmed before a most significant bit of the memory cells. However, the order of programming can also be readily modified. Moreover, those skilled in the art will recognize that a wide variety of additional modifications can be made to the exemplary embodiments described below without departing from the scope of the invention. Finally, many of the well known functions, variations, and nuances of nonvolatile memory systems have been intentionally simplified or omitted from this description where their description is not presently necessary to enable one skilled in the art to make and use the claimed invention.

Figure 6:
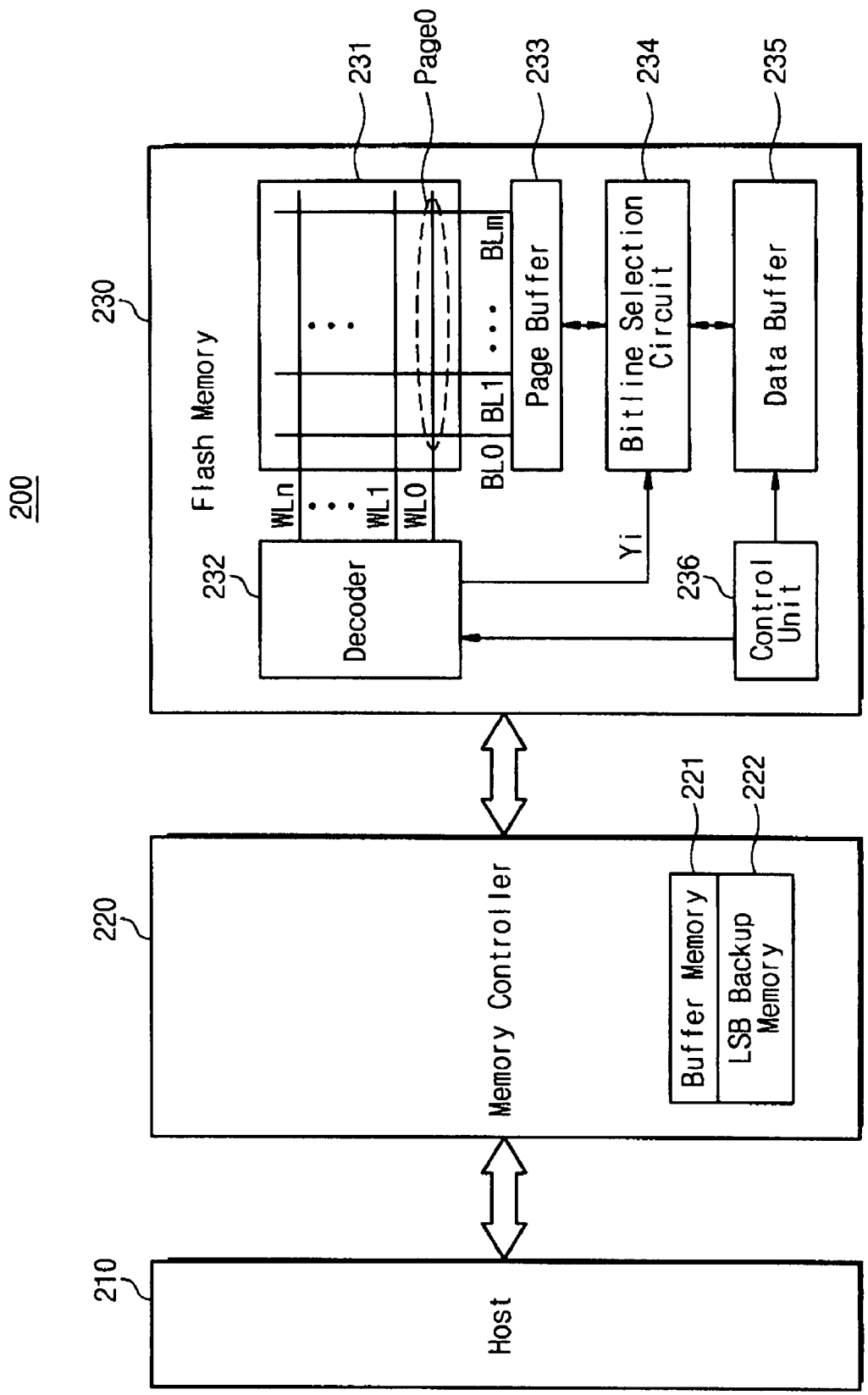
FIG. 6 is a schematic block diagram illustrating a nonvolatile memory system according to an embodiment of the invention.

FIG. 6 is a schematic block diagram illustrating a nonvolatile memory system according to an embodiment of the invention.

Referring to FIG. 6, a nonvolatile memory system 200 comprises a host 210, a memory controller 220, and a flash memory 230. Memory controller 220 comprises a buffer memory 221 and a least significant bit (LSB) backup memory 222. Flash memory 230 comprises a memory cell array 231, a decoder 232, a page buffer 233, a bitline selection circuit 234, a data buffer 235, and a control unit 236.

In memory controller 220, buffer memory 221 temporarily stores data to be programmed in flash memory 230 during program operations. Buffer memory 221 also temporarily stores data read from flash memory 230 during read operations. Buffer memory 221 operates under the control of memory controller 220 and receives data from host 210 and transfers data to flash memory 230 during program operations, and receives data from flash memory 230 and transfers data to host 210 during read operations.

LSB backup memory 222 stores data that has already been stored in selected memory cells of flash memory 230 before program data stored in buffer memory 221 is programmed to the selected memory cells. For example, during a program operation of the selected memory cells, buffer memory 221 may store MSB data to be programmed in the selected memory cells. Memory controller therefore controls flash memory 230 to transfer LSB data already stored in the selected memory cells in LSB backup memory 222. Because LSB backup memory 222 stores data that has already been programmed in the selected memory cells, and buffer memory 221 stores data yet to be programmed in the selected memory cells, if an error or malfunction occurs while programming the selected memory cells, any data lost from the selected memory cells can be recovered from buffer memory 221 and LSB backup memory 222. As a result, the presence of LSB backup memory 222 increases the reliability of nonvolatile semiconductor memory device 200 of FIG. 6.

In general, buffer memory 221 and LSB backup memory 222 can be arranged in a single memory chip. For instance, memory controller 220 could store the data already programmed in the selected memory cells in a first region of a dynamic random access memory (DRAM) chip referred to as LSB backup memory 222, and memory controller 220 could store the data yet to be programmed in the selected memory cells in a second region of the DRAM chip referred to as buffer memory 221.

In flash memory 230, memory cell array 231 stores programmed data. Decoder 232 receives read and program addresses from memory controller 220 via control unit 236 and controls activation or selection of wordlines and bitlines for read and program operations in accordance with the read and program addresses. In the example of FIG. 6, decoder 232 is connected to memory cell array 231 via word lines WL0 through WLn, and produces a bitline selection signal Yi to control the activation or selection of bitlines for program and read operations by bitline selection circuit 234.

Page buffer 233 is connected to memory cell array 231 via bitlines BL0 through BLm and temporarily stores data to be programmed in memory cell array 231 in program operations and data read from memory cell array 231 in read operations. Bitline selection circuit 234 controls activation or selection of bitlines for programming and read operations based on bitline selection signal Yi. The selected or activated bit lines are driven to program or read the selected memory cells in memory cell array 231 based on the data stored in page buffer 233.

Data buffer 235 is an input/output buffer used to transfer data between memory controller 220 and flash memory 230. For example, in a read operation, data stored in selected memory cells is transferred from memory cell array 231 to data buffer 235 via page buffer 233 and bitline selection circuit 234. Next, the data is transferred from data buffer 235 to memory controller 220, and thereafter the data is transferred to host 210. In a program operation, on the other hand, data to be programmed in selected memory cells of memory cell array 231 is transferred from host 210 to memory controller 220 and thereafter to data buffer 235. Then, the data is transferred from data buffer 235 to page buffer 233 via bitline selection circuit 234, and thereafter, the data is programmed in the selected memory cells. Data buffer 235 operates under the control of control unit 236, which in turn operates in response to control signals produced by memory controller 220.

Memory cell array 231 comprises a plurality of multi-bit nonvolatile memory cells arranged in rows and columns. As an example, cell array 231 may comprise a NAND flash memory array including NAND flash memory cells arranged in a plurality of NAND strings. Typically, the columns of memory cell array 231 are connected to corresponding bitlines and the rows are connected to corresponding wordlines.

Each row of multi-bit nonvolatile memory cells connected to the same wordline in memory cell array 231 corresponds to one or more pages of data storage. For example, a page "Page0" is illustrated in FIG. 6 by a dotted oval. Memory cell array 231 is further arranged into a plurality of blocks, each comprising a plurality of pages. As a typical example, each page may include 512 bytes or 2 Kbytes of data and each block may include 32 or 64 pages of data.

Typically, though not necessarily, programming and read operations are performed on memory cell array 231 one page at a time and erase operations are performed a block at a time. As an alternative, for example, memory cell array 231 could also be programmed in units of one or more blocks at a time.

In the example of FIG. 6, the memory cells in memory cell array 231 are 2-bit nonvolatile memory cells. These memory cells are programmed by first programming a LSB and then later programming a MSB. The LSB and the MSB of each memory cell are not necessarily programmed in immediate succession. In other words, the LSB of a selected memory cell may be programmed first, followed by programming of other memory cells, followed by programming of the MSB of the selected memory cell. In the example of FIG. 6, the memory cells in memory cell array 231 are programmed and read one page at a time and erased one block at a time.

As described previously, the multi-level memory cells in the example of FIG. 6 and other embodiments could alternatively store more than two bits. For example, the memory cells could be 3-bit memory cells, 4-bit memory cells, and so on. In such memory cells adapted to store different numbers of bits, data to be stored in the memory cells can be referred to generally as 1-bit data, 2-bit data, 3-bit, data, and so on, as opposed to simply LSB data and MSB data as in the case of 2-bit memory cells. For instance, in a four bit memory cell storing a data string "0100", the bit "1" will be referred to as 3-bit data because it is in a third position in the string.

Figure 5:
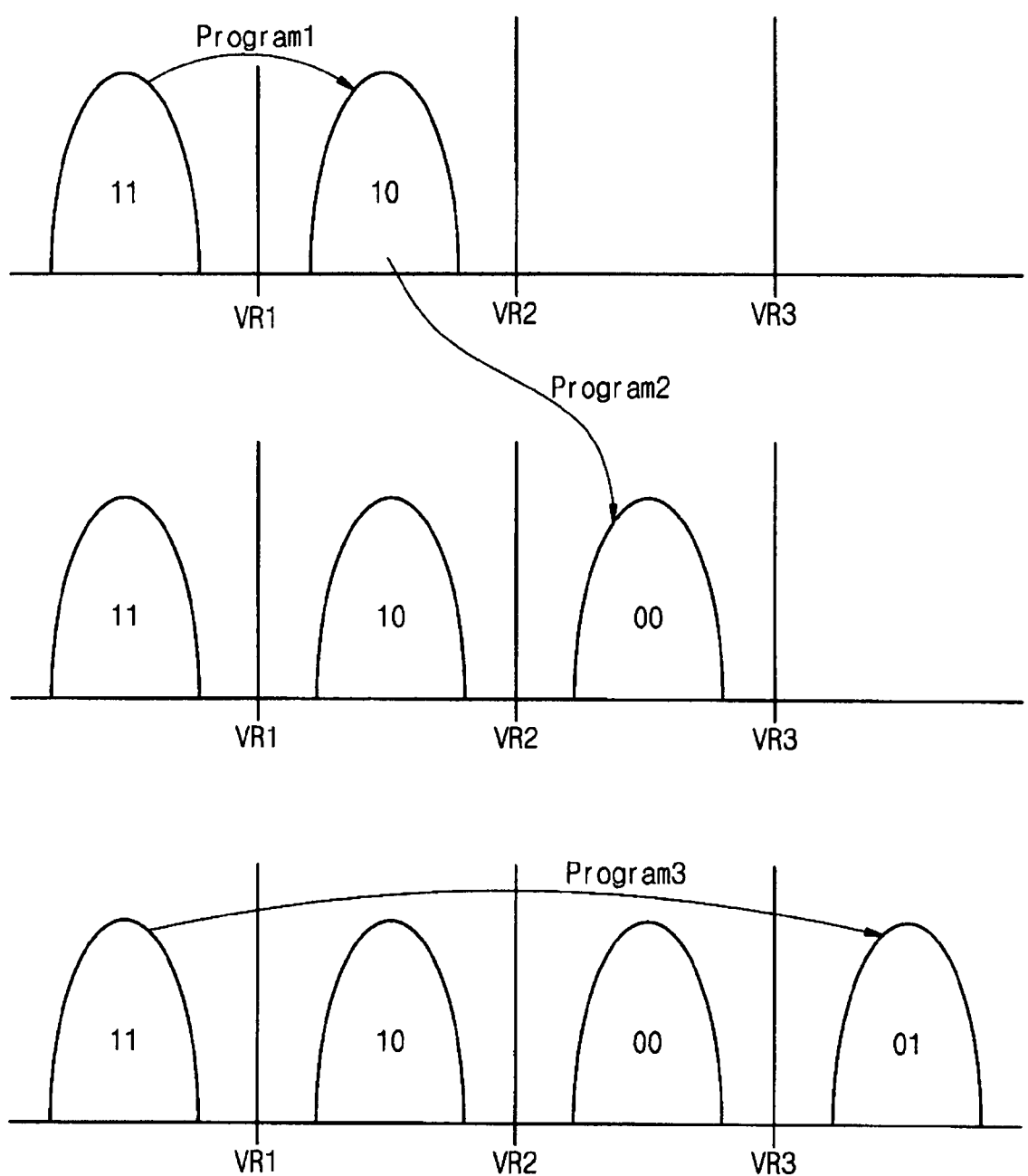
FIG. 5 is a threshold voltage distribution diagram illustrating another type of program operation for nonvolatile memory cells in a nonvolatile memory system.

Also described previously, the multi-level memory cells in the example of FIG. 6 and other embodiments could be alternatively programmed in different orders. For instance, higher order bits (e.g., MSB data) could be programmed before lower order bits (e.g., LSB data). Moreover, the programming order could be further modified by rearranging the order of assignments between logic states and threshold voltage distributions, e.g., such as those illustrated in FIG. 5.

Figure 7:
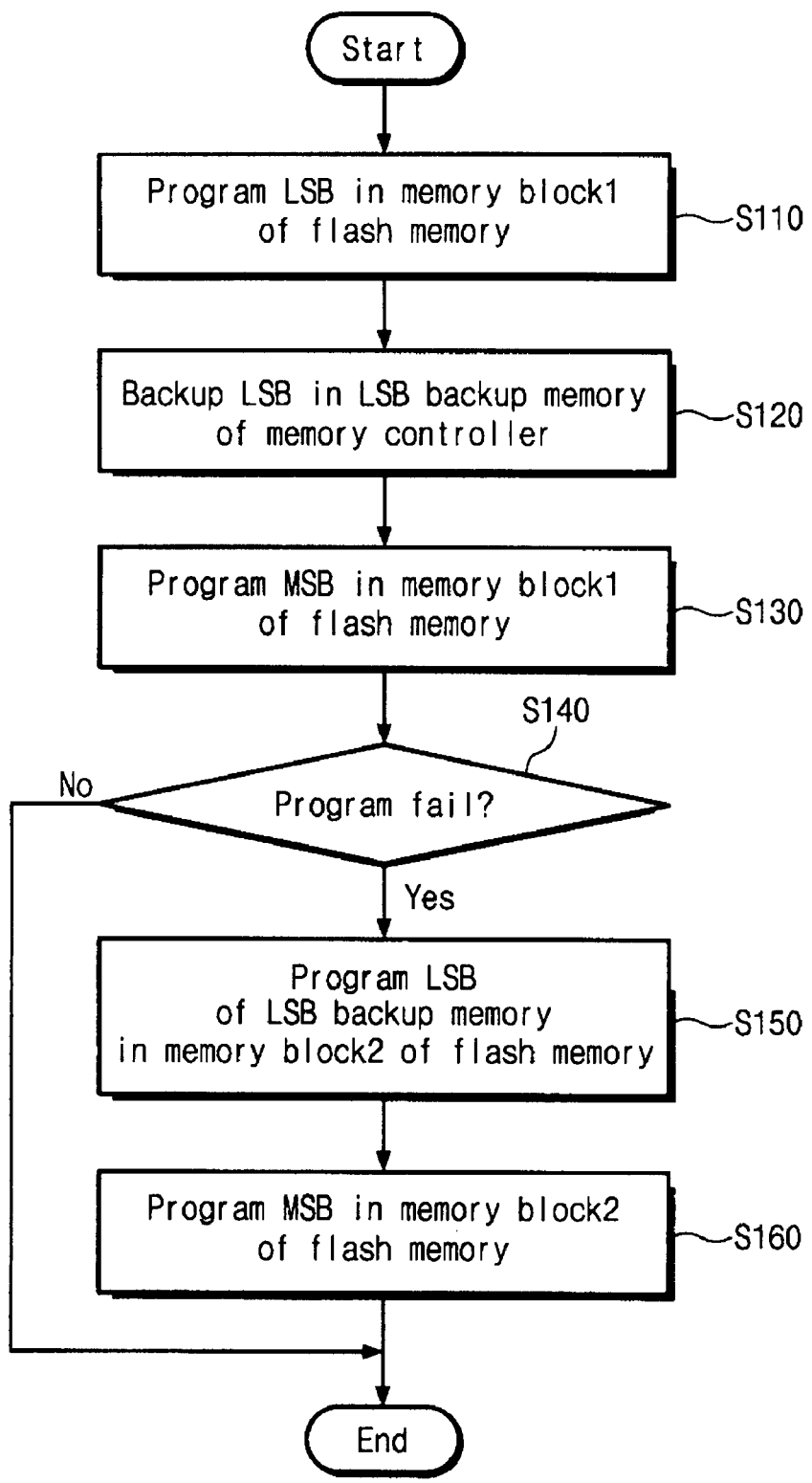
FIG. 7 is a flowchart illustrating a programming method for a nonvolatile memory system according to an embodiment of the invention.

FIG. 7 is a flowchart illustrating a method of programming nonvolatile memory system 200 illustrated in FIG. 6 according to an embodiment of the invention. Although the method illustrated in FIG. 7 relates to nonvolatile memory system 200, the method can be readily modified to function with various different nonvolatile memory systems according to other embodiments of the invention. In the description that follows, exemplary method steps will be denoted by parentheses (SXXX) to distinguish them from exemplary graphical and system elements such as those illustrated in FIGS. 1 through 5.

Referring to FIG. 7, memory controller 220 controls flash memory 230 to program a page of LSB data into selected memory cells of a first memory block block1 of memory cell array 231 (S110). After programming the LSB data in the selected memory cells, flash memory 230 typically performs a program-verify operation to determine whether the LSB data was successfully programmed in the selected memory cells. In the method of FIG. 7, it will be assumed that the LSB data is successfully programmed. In general, the method will not proceed until the LSB data is successfully programmed in the selected memory cells. After the page of LSB data is programmed into the selected memory cells, other program operations may be performed for different memory cells in memory cell array 231 before MSB data is programmed into the selected memory cells.

Once the MSB data is about to be programmed into the selected memory cells, memory controller 220 controls flash memory 230 to back up the LSB data in the selected memory cells by transferring the LSB data to LSB backup memory 222 of memory controller 220 (S120). Once the LSB data from the selected memory cells is stored in LSB backup memory 222, a page of MSB data is programmed in the selected memory cells of first memory block block1 of flash memory 230. (S130).

After the LSB and MSB data have been programmed in the selected memory cells of block1 in steps S10 and S130, respectively, flash memory 230 performs a program-verify operation to determine whether the MSB data has been successfully programmed in the selected memory cells (S140). Where flash memory 230 determines that the MSB data has been successfully programmed in the selected memory cells, the method terminates, as indicated by an arrow labeled "No" (indicating no program failure) in FIG. 7. Otherwise, where flash memory 230 determines that the data has not been successfully programmed in the selected memory cells, memory controller 220 controls flash memory 230 to program the page of LSB data into a second memory block block2 in flash memory 230 (S150), and then memory controller 220 controls flash memory 230 to program the page of MSB data into second memory block block2 in flash memory 230 (S160). After the LSB and MSB data are successfully programmed in flash memory 230, the programming method of FIG. 7 terminates.

Figure 8:
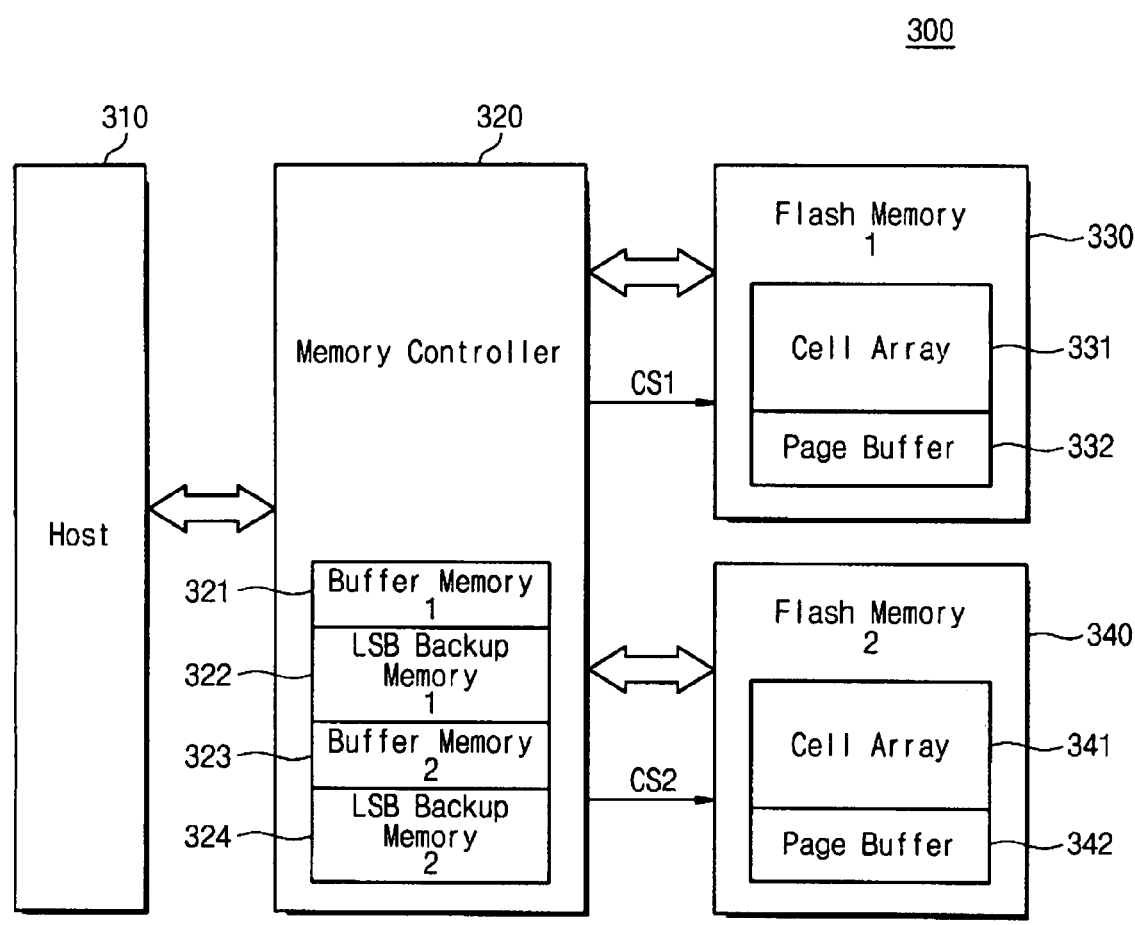
FIG. 8 is a schematic block diagram illustrating a nonvolatile memory system according to another embodiment of the invention.

FIG. 8 is a schematic block diagram illustrating a nonvolatile memory system 300 according to another embodiment of the invention.

Referring to FIG. 8, nonvolatile memory system 300 comprises a host 310, a memory controller 320, and first and second flash memory chips 330 and 340. Memory controller 320 comprises a first buffer memory 321, a first LSB backup memory 322, a second buffer memory 323, and a second LSB backup memory 324. Typically, first and second buffer memories 321 and 323 and first and second LSB backup memories 322 and 324 are formed on a single chip such as a DRAM. First flash memory chip 330 comprises a first cell array 331 and a first page buffer 332 and second flash memory chip 340 comprises a second cell array 341 and a second page buffer 342.

In nonvolatile memory system 300, host 310 and memory controller 320 function similar to host 210 and memory controller 220 in FIG. 6, respectively. In addition, first and second flash memory chips 330 and 340 each function similar to flash memory 230 in FIG. 6. However, in memory controller 320, first buffer memory 321 and first LSB backup memory 322 each store data used for programming and reading first flash memory chip 330 and second buffer memory 323 and second LSB backup memory 324 each store data used for programming and reading second flash memory chip 340. Moreover, flash memory chip 330 functions in response to a first chip selection signal CS1 generated by memory controller 320 and flash memory chip 340 functions in response to a second chip selection signal CS2 generated by memory controller 320.

In a program operation of nonvolatile memory system 300, memory controller 320 first selects one of first and second flash memory chips 330 and 340 using first and second chip selection signals CS1 and CS2. Then, memory cells in the selected memory chip are programmed using a programming method such as that illustrated in FIG. 7. In other words, LSB data is first programmed into selected memory cells in a first block within the selected memory chip. Then, before MSB data is programmed into the selected memory cells in the first block, the LSB data is transferred into a LSB backup memory corresponding to the selected memory chip. Next, MSB data is programmed into the selected memory cells in the first block, and the selected memory chip then performs a program-verify operation to determine whether the MSB data was successfully programmed in those selected memory cells. Where the MSB data was successfully programmed in the selected memory cells, the program operation terminates. Otherwise, where an error or malfunction occurs during programming of the MSB data in the selected memory cells in the first block, the LSB data and the MSB data can be recovered from the LSB backup memory and the buffer memory corresponding to the selected memory chip and programmed in a second memory block in the selected flash memory chip or in the other flash memory chip.

Similarly, in a read operation of nonvolatile memory system 300, memory controller 320 selects first or second flash memory chip 330 or 340 according to an address of memory cells to be read. Then, the selected flash memory chip and memory controller 320 perform a read operation similar to that described above in relation to nonvolatile memory system 100 or 200.

Figure 9:
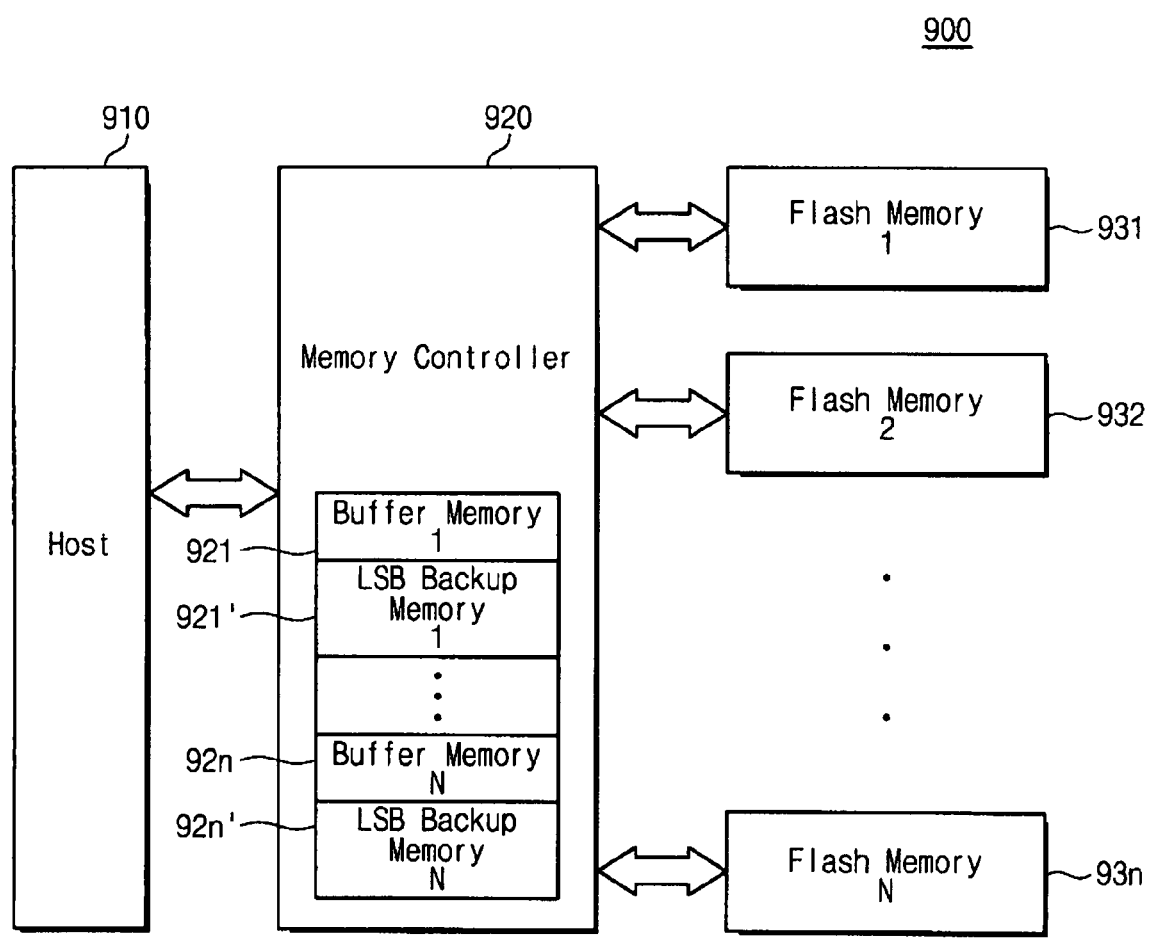
FIG. 9 is a schematic block diagram illustrating a nonvolatile memory system according to still another embodiment of the invention.

FIG. 9 is a schematic block diagram illustrating a nonvolatile memory system 900 according to still another embodiment of the invention. Nonvolatile memory system 900 is similar to nonvolatile memory system 300, except that nonvolatile memory system 900 can include an arbitrary number "n" of flash memory chips and corresponding buffer memories and LSB backup memories rather than two.

Referring to FIG. 9, nonvolatile memory system 900 comprises a host 910, a memory controller 920, and a plurality of flash memory chips 931 through 93n. Memory controller 920 includes a buffer memory and a LSB backup memory for each flash memory chip. More particularly, memory controller 920 includes buffer memories 921 through 92n and corresponding LSB backup memories 921' through 92n'. Typically, buffer memories 921 through 92n and LSB backup memories 921' through 92n' are formed on a single chip such as a DRAM.

In a program operation, nonvolatile memory system 900 selects one of flash memory chips 931 through 93n by activating (or deactivating) one of a plurality of corresponding chip select signals and then programs selected memory cells in the selected flash memory chip using a method similar to that described in relation to nonvolatile memory system 300. Likewise, a read operation of nonvolatile memory system 900 may also be carried out in a manner similar to nonvolatile memory system 300 by selecting one of flash memory chips 931 through 93n and then reading data from the selected flash memory chip through a corresponding buffer memory in memory controller 920.

In the exemplary nonvolatile memory systems illustrated in FIGS. 8 and 9 and in other systems including multiple nonvolatile memory chips, the multiple nonvolatile memory chips may be programmed or read either one at a time or in parallel. As examples of how multiple nonvolatile memory chips could be programmed or read in parallel, the "n" flash memory chips illustrated in FIG. 9 could be programmed or read using interleaved program or read operations or using simultaneous parallel data transfers, where both the interleaved operations or parallel data transfers can be controlled by memory controller 920. To facilitate the simultaneous parallel data transfers and/or the interleaved operations, the "n" flash memory chips 931 through 93n may be connected to memory controller via a plurality of interfaces such as a plurality of independent data buses.

Unfortunately, in the systems illustrated in FIGS. 6, 8, and 9, the process of backing up LSB data tends to slow down the performance of program operations. Since each of these systems backs up LSB data each time MSB data is programmed, the process of backing up the LSB data can significantly impair the performance of these systems.

Accordingly, several additional embodiments of the invention illustrated in FIGS. 10 through 15 are provided wherein a loss of LSB data is prevented even without backing up LSB data each time MSB data is programmed. Instead, these additional embodiments only back up LSB data where an error or malfunction occurs during MSB programming.

As with other embodiments of the invention, in these additional embodiments, the description of programming LSB data followed by programming MSB data is used as a mere teaching example. As an alternative to this example, the order of the program operation could be modified so that the MSB data is programmed first, followed by the LSB data. In such a case, the MSB data could be backed up if programming of the LSB data fails. In yet other alternatives, the number of bits stored in each memory cell as well as the programming order of each memory cell could be variously modified.

Figure 10:
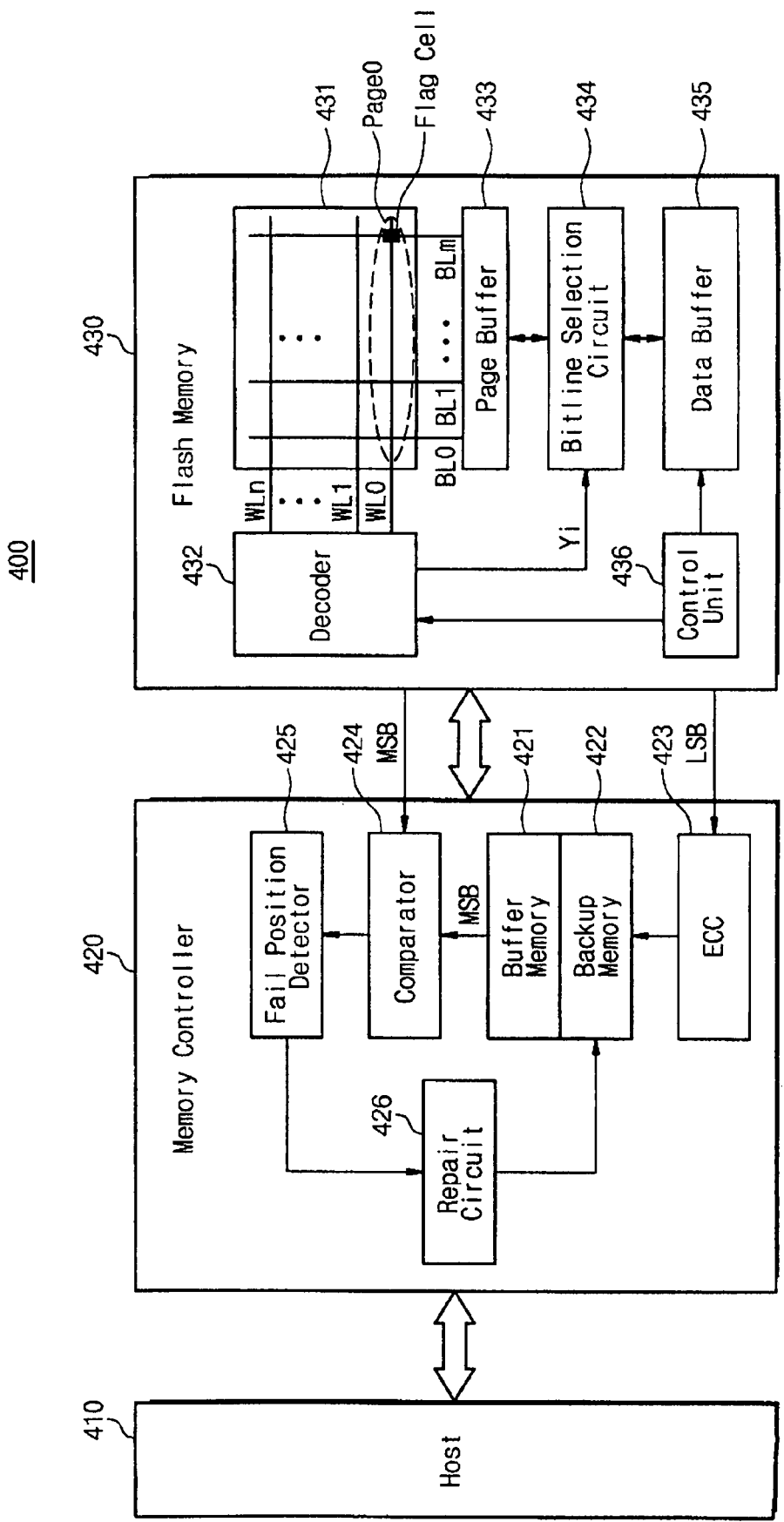
FIG. 10 is a schematic block diagram illustrating a nonvolatile memory system according to still another embodiment of the invention.

FIG. 10 illustrates a nonvolatile memory system 400 according to one embodiment of the invention. Various features of memory system 400 are described below with reference to FIG. 10. The operation of these features are described in further detail with reference to FIGS. 11 through 13.

Referring to FIG. 10, nonvolatile memory system 400 comprises a host 410, a memory controller 420, and a flash memory 430. Memory controller 420 comprises a buffer memory 421, a backup memory 422 (also referred to as a "repair memory"), an error correction unit 423, a comparator 424, a fail position detector 425, and a repair circuit 426. Flash memory 430 comprises a memory cell array 431, a decoder 432, a page buffer 433, a bitline selection circuit 434, a data buffer 435, and a control unit 436.

In memory controller 420, buffer memory 421 stores data to be programmed in flash memory 430. Buffer memory 421 operates under the control of memory controller 420 and transfers data from host 410 and to flash memory 430 during program operations, and transfers data from flash memory 430 and to host 410 during read operations. For instance, before a page of LSB or MSB data is programmed in flash memory 430, the data is typically stored in buffer memory 421. If programming of the LSB or MSB data in flash memory 430 fails, the data stored in buffer memory 421 may be used to recover the data and program the data into a different location in flash memory 430. In general, a failure to program the LSB or MSB data in selected memory cells of flash memory 430 may result in one or more erroneous bits being stored in one or more of the selected memory cells. However, for simplicity of explanation, some of the description that follows assumes that a programming failure has occurred in a single one of the selected memory cells.

Backup memory 422 stores data used to recover from an error or malfunction in a program operation of flash memory 430. For example, where LSB data has been previously programmed in selected memory cells of flash memory 430 and the selected memory cells are further programmed with MSB data, if the further programming of the MSB data fails, data stored in the selected memory cells after the programming failure can be loaded into backup memory 422 and used to recover the LSB data that was previously programmed in the selected memory cells.

In general, buffer memory 421 and backup memory 422 can be arranged in a single memory chip. For instance, memory controller 420 could store the data already programmed in the selected memory cells in a first region of a dynamic random access memory (DRAM) chip referred to as backup memory 422, and memory controller 420 could store data yet to be programmed in the selected memory cells in a second region of the DRAM chip referred to as buffer memory 421.

Error correction unit 423 is used to detect and correct errors in data stored in backup memory 422. For example, suppose that the data stored in backup memory 422 includes a page of error-coded data. Depending on the nature and/or number of errors in the error-coded data, error correction unit 423 can use an error correction code within the page of error coded-data to detect and correct errors in the error-coded data.

Comparator 424 compares data stored in selected memory cells of flash memory 430 with data stored in buffer memory 421 in order to detect and correct programming errors. For instance, after MSB data stored in buffer memory 421 is programmed into selected memory cells of flash memory 430, the MSB data may be read from the selected memory cells and compared to the MSB data stored in buffer memory 421. Typically, such a comparison is made after an error or malfunction occurs when programming the MSB data into the selected memory cells. As will be explained below with reference to FIGS. 11 through 13, the comparison of the MSB data can be used to detect and correct errors in LSB data previously programmed in the selected memory cells.

Fail position detector 425 receives an output of comparator 424 and uses the output of comparator 424 to determine a location of a programming failure (i.e., a location of an improperly programmed memory cell or one or more erroneous bits) in the selected memory cells of flash memory 430. Fail position detector 425 stores an address of flash memory 430 corresponding to the location of the programming failure and outputs the location to repair circuit 426.

Repair circuit 426 receives the location of the programming failure from fail position detector 425 and uses the location of the programming failure to modify data stored in backup memory 422. In other words, where a programming failure (i.e., errors in one or more memory cells) has occurred, data stored in backup memory 422 may contain one or more error. The location of the programming failure is used to modify the data stored in backup memory 422 to correct the errors.

In flash memory 430, memory cell array 431 stores programmed data. Memory cell array 431 comprises a plurality of multi-bit memory cells arranged in rows and columns, where each row of memory cells is connected to a corresponding word line, and each column of memory cells is connected to a corresponding bit line. Each row of memory cells connected to the same word line corresponds to multiple pages of data. For instance, where the multi-bit memory cells are each 2-bit memory cells, each word line corresponds to two pages of data.

Memory cell array 431 further comprises a plurality of flag cells corresponding to the rows of multi-bit memory cells. In particular, each row of multi-bit memory cells is connected to a corresponding flag cell indicating which pages of data corresponding to the row have been programmed. For instance, where each row corresponds to two pages of data, each flag cell may have a first state indicating that a page of LSB data has been programmed in the memory cells of the corresponding row, and a second state indicating that a page of MSB data has been programmed in the memory cells of the corresponding row.

Page buffer 433 is connected to memory cell array 431 via bitlines BL0 through BLm and temporarily stores data to be programmed in memory cell array 431 in program operations and data read from memory cell array 431 in read operations. Bitline selection circuit 434 controls activation or selection of bitlines for programming and read operations based on bitline selection signal Yi. The selected or activated bit lines are driven to program or read the selected memory cells in memory cell array 431 based on the data stored in page buffer 433. Typically, though not necessarily, programming and read operations are performed on memory cell array 431 one page at a time. As an example, a page of data to be programmed in memory cell array 431 is first transferred to page buffer 433. Then, appropriate voltages are applied to a wordline and bitlines corresponding to a row of memory cells to be programmed in memory cell array 431 based on the page of data stored in page buffer 433.

Decoder 432 receives read and program addresses from memory controller 420 via control unit 436 and controls activation or selection of wordlines and bitlines for read and program operations in accordance with the read and program addresses. In the example of FIG. 10, decoder 432 is connected to memory cell array 431 via word lines WL0 through WLn, and produces a bitline selection signal Yi to control the activation or selection of bitlines for program and read operations by bitline selection circuit 434.

Data buffer 435 is an input/output buffer used to transfer data between memory controller 420 and flash memory 430. For example, in a read operation, data stored in selected memory cells is transferred from memory cell array 431 to data buffer 435 via page buffer 433 and bitline selection circuit 434. Next, the data is transferred from data buffer 435 to memory controller 420, and thereafter the data is transferred to host 410. In a program operation, on the other hand, data to be programmed in selected memory cells of memory cell array 431 is transferred from host 410 to memory controller 420 and thereafter to data buffer 435. Then, the data is transferred from data buffer 435 to page buffer 433 via bitline selection circuit 434, and thereafter, the data is programmed in the selected memory cells. Data buffer 435 operates under the control of control unit 436, which in turn operates in response to control signals produced by memory controller 420.

Figure 11:
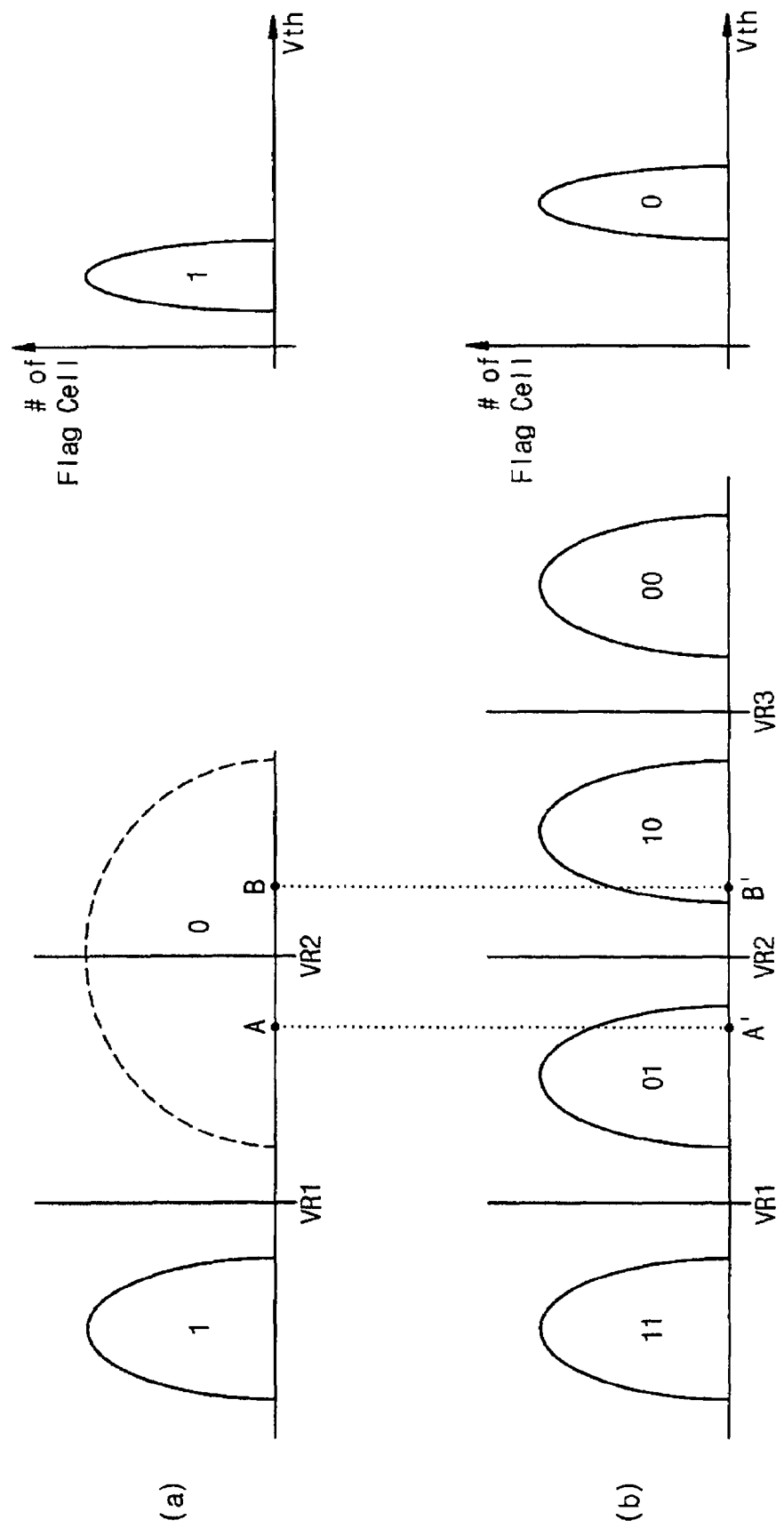
FIG. 11 is a threshold voltage distribution diagram illustrating one type of program operation for nonvolatile memory cells in the nonvolatile memory system of FIG. 10.

FIG. 11 is a threshold voltage distribution diagram illustrating one type of program operation for selected memory cells in the nonvolatile memory system of FIG. 10. In FIG. 11, a pair of threshold voltage distribution diagrams labeled "(a)" illustrates a LSB program operation of a selected memory cell in the nonvolatile memory system of FIG. 10 and a pair of threshold voltage distribution diagrams labeled "(b)" illustrates a MSB program operation of the selected memory cell in the nonvolatile memory system of FIG. 10. The pair of threshold voltage diagrams labeled "(a)" will be collectively referred to hereafter as diagram "(a)" and the pair of threshold voltage diagrams labeled "(b)" will be referred to hereafter as diagram "(b)".

Figure 1:
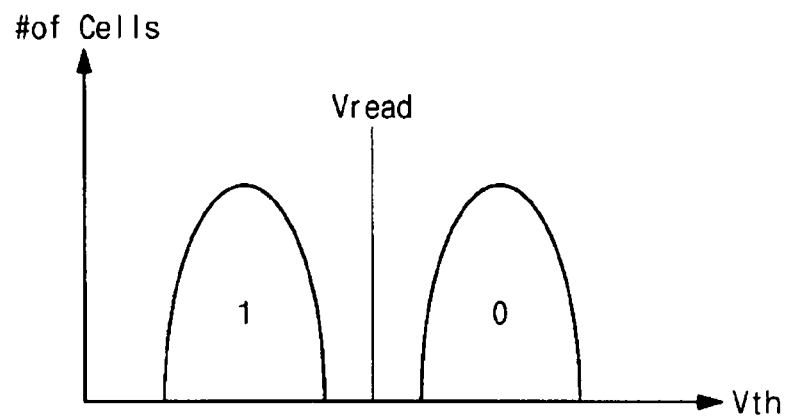
FIG. 1 is a graph illustrating two distinct threshold voltage distributions used to store data in a single-level flash memory cell.
Figure 2:
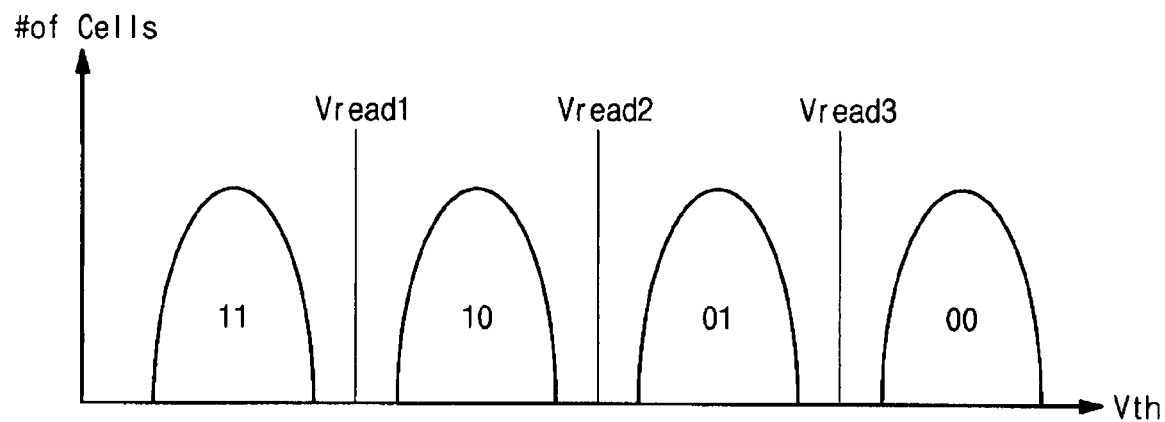
FIG. 2 is a graph illustrating four distinct threshold voltage distributions used to store data in a multi-level flash memory cell.
Figure 3:
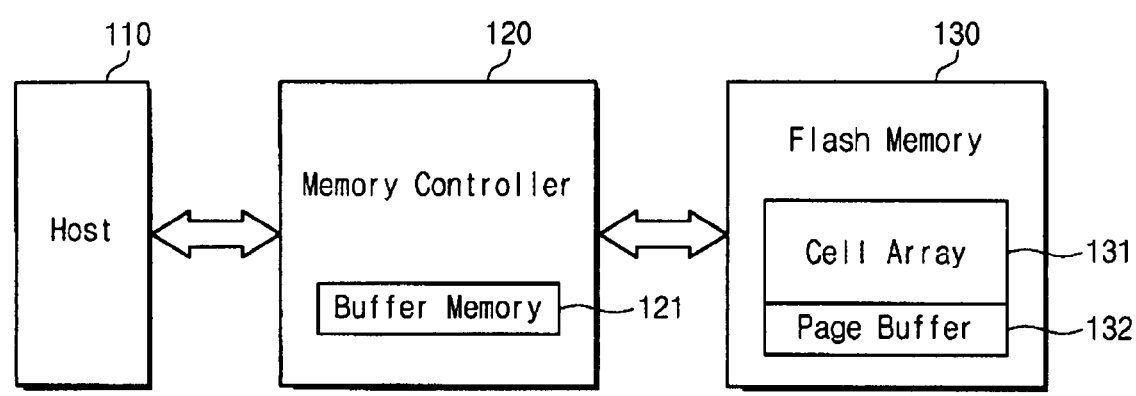
FIG. 3 is a schematic block diagram illustrating a conventional nonvolatile memory system.
Figure 4:
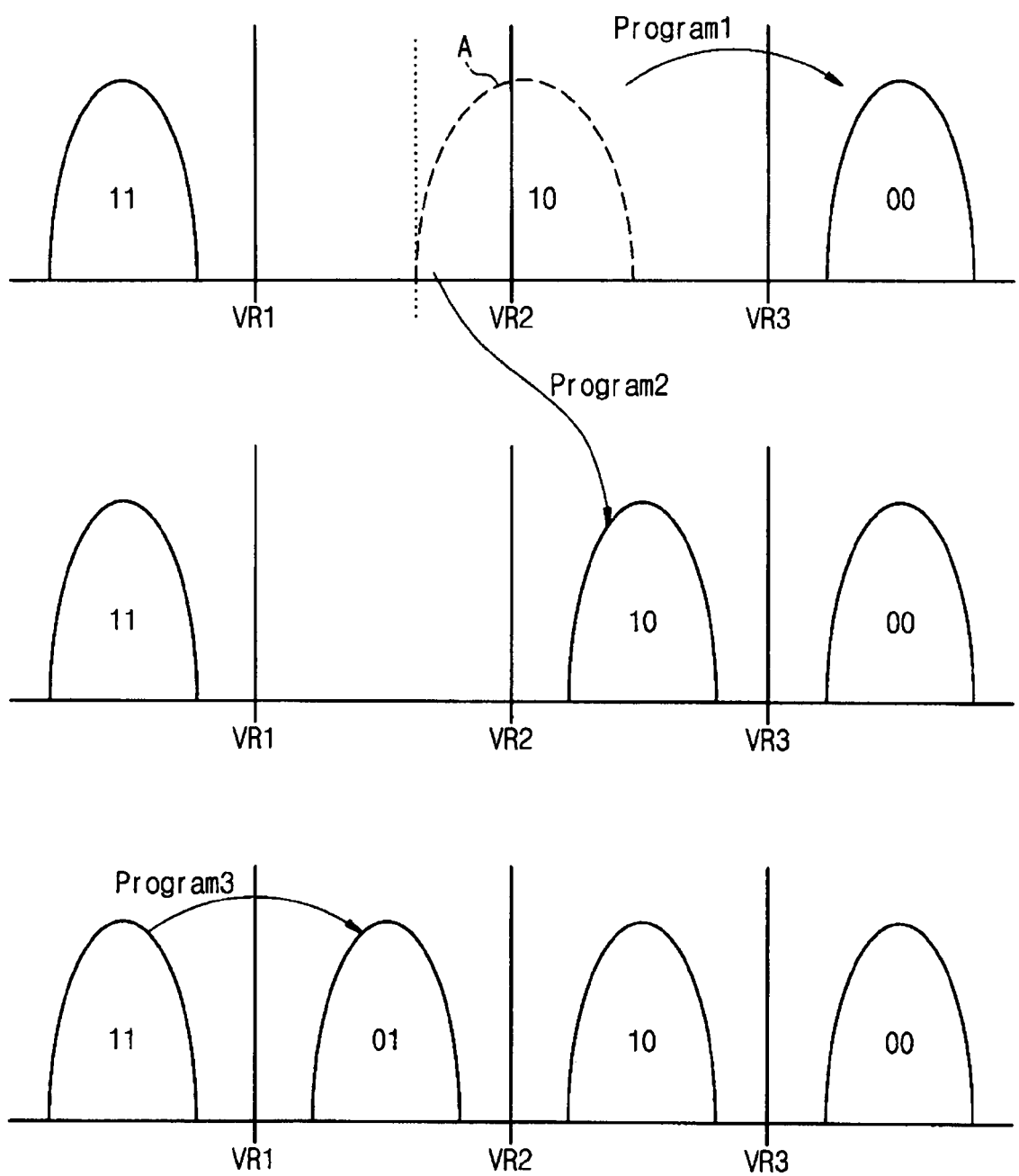
FIG. 4 is a threshold voltage distribution diagram illustrating one type of program operation for nonvolatile memory cells in a nonvolatile memory system.

The program operation of FIG. 11 is similar to the program operation illustrated in FIG. 4, except that in the program operation of FIG. 11, a flag cell is used to indicate whether MSB programming has been performed on the selected memory cell. It should be noted that the program operation of FIG. 4 could also use a flag cell. However, the flag cell was omitted from the description of FIG. 4 for simplicity of explanation.

For explanation purposes, it will be assumed that a flag cell described in relation to FIG. 11 is connected to a row where the selected memory cell is located. Where MSB programming has not been performed on the row where the selected memory cell is located, the flag cell has logic state "1", and where MSB programming has been performed on the row where the selected memory cell is located, the flag cell has logic state "0". Where MSB programming has not been performed on the selected memory cell, a read voltage VR1 is used to determine whether the LSB of the selected memory cell is a logical "1" or a logical "0", and where MSB programming has been performed on the selected memory cell, a read voltage VR2 is used to determine whether the LSB of the selected memory cell is a logical "1" or a logical "0".

Like the selected memory cell of FIG. 4, the selected memory cell of FIG. 11 is a multi-bit nonvolatile memory cell capable of storing two bits of data. The selected memory cell of FIG. 11 can store two bits of data in relation to four threshold voltage distributions respectively labeled "11", "10", "10", and "00" in diagram (b). The selected memory cell can also store one bit of data in relation to a threshold voltage distribution labeled "1" and a threshold voltage distribution labeled "0" on the left hand side of diagram (a).

In a program operation of the selected memory cell of FIG. 11, the selected memory cell is initially in an erased state corresponding to the threshold voltage distribution labeled "1" on the left hand side of diagram (a) and the threshold voltage distribution labeled "11" in diagram (b). In addition, the flag cell is initially in an erased state corresponding to a threshold voltage distribution labeled "1" on the right hand side of diagram (a).

In the program operation, a LSB of the selected memory cell is programmed with LSB data, and then a MSB of the selected memory cell is programmed with MSB data. Where the LSB is programmed to store a logical "0", the threshold voltage of the selected memory cell should transition from the threshold voltage distribution labeled "1" in diagram (a) to the threshold voltage distribution labeled "0" in diagram (a). Otherwise, the threshold voltage of the selected memory cell should remain in the threshold voltage distribution labeled "1".

However, after the LSB of the selected memory cell has been programmed, a program-verify operation is performed to ensure that the LSB of the selected memory cell is programmed to its intended logic state. Where the LSB of the memory cell does not have the intended logic state, the LSB of the selected memory cell may be further programmed using the LSB data stored in buffer memory 421, or alternatively, a LSB programming error or malfunction may be detected. Where a LSB programming error or malfunction is detected, a different memory cell, e.g., in a different page or block of memory cell array 431 may be selected and the LSB data may be programmed from buffer memory 421 into the different memory cell. If the program-verify operation determines that the LSB of the selected memory cell is programmed to the intended logic state, then programming of the LSB is considered to be successful. Upon successful programming of the LSB, the flag cell remains in the erased state.

Supposing that the LSB of the selected memory cell has been successfully programmed to logical "0", then where the MSB of the selected memory cell is programmed, the memory cell should transition from the intermediate threshold voltage distribution labeled "0" in diagram (a) to either the threshold voltage distribution labeled "10" or the threshold voltage distribution labeled "00" in diagram (b), depending on whether the MSB is a logical "1" or a logical "0", respectively. Otherwise, supposing that the LSB of the selected memory cell has been successfully programmed to logical "1", then where the MSB of the selected memory cell is programmed, the memory cell should transition from the threshold voltage distribution labeled "1" in diagram (a) to the threshold voltage distribution labeled "11" or the threshold voltage distribution labeled "01" in diagram (b), depending on whether the MSB is a logical "1" or a logical "0", respectively.

After the MSB of the selected memory cell has been programmed, a program-verify operation is performed to ensure that the MSB and the LSB of the selected memory cell are programmed to their intended logic states. If the program-verify operation determines that the MSB and the LSB of the selected memory cell are programmed to their intended logic states, then programming of the MSB is considered to be successful. Upon successful programming of the MSB, the flag cell transitions to the threshold voltage distribution labeled "0" in diagram (b). On the other hand, where the MSB or the LSB of the memory cell does not have its intended logic state, the MSB of the selected memory cell may be further programmed, or alternatively, a MSB programming error or malfunction may be detected. Where a MSB programming error or malfunction is detected, the MSB data can be readily recovered from buffer memory 421 for programming into a different memory cell. Unfortunately, however, where a MSB programming error or malfunction is detected, LSB data previously stored in the selected memory cell may be modified. Since buffer memory 421 no longer stores the LSB data when the MSB of the selected memory cell is programmed, a nontrivial recovery process may be required to determine the correct logic state for the selected memory cell.

Figure 12:
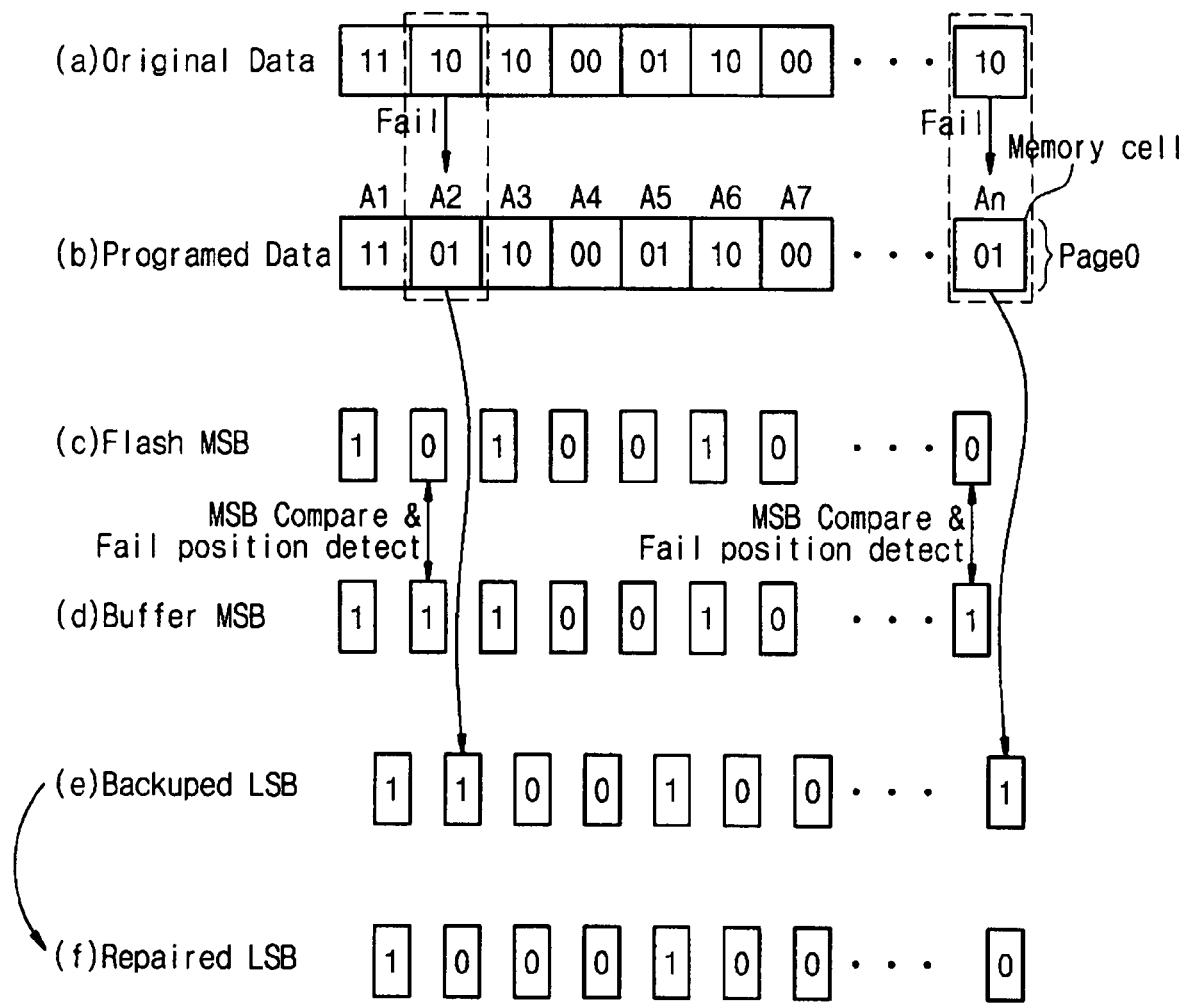
FIG. 12 is a diagram illustrating a fail position detection and data restoration operation of the nonvolatile memory system of FIG. 10.
Figure 13:
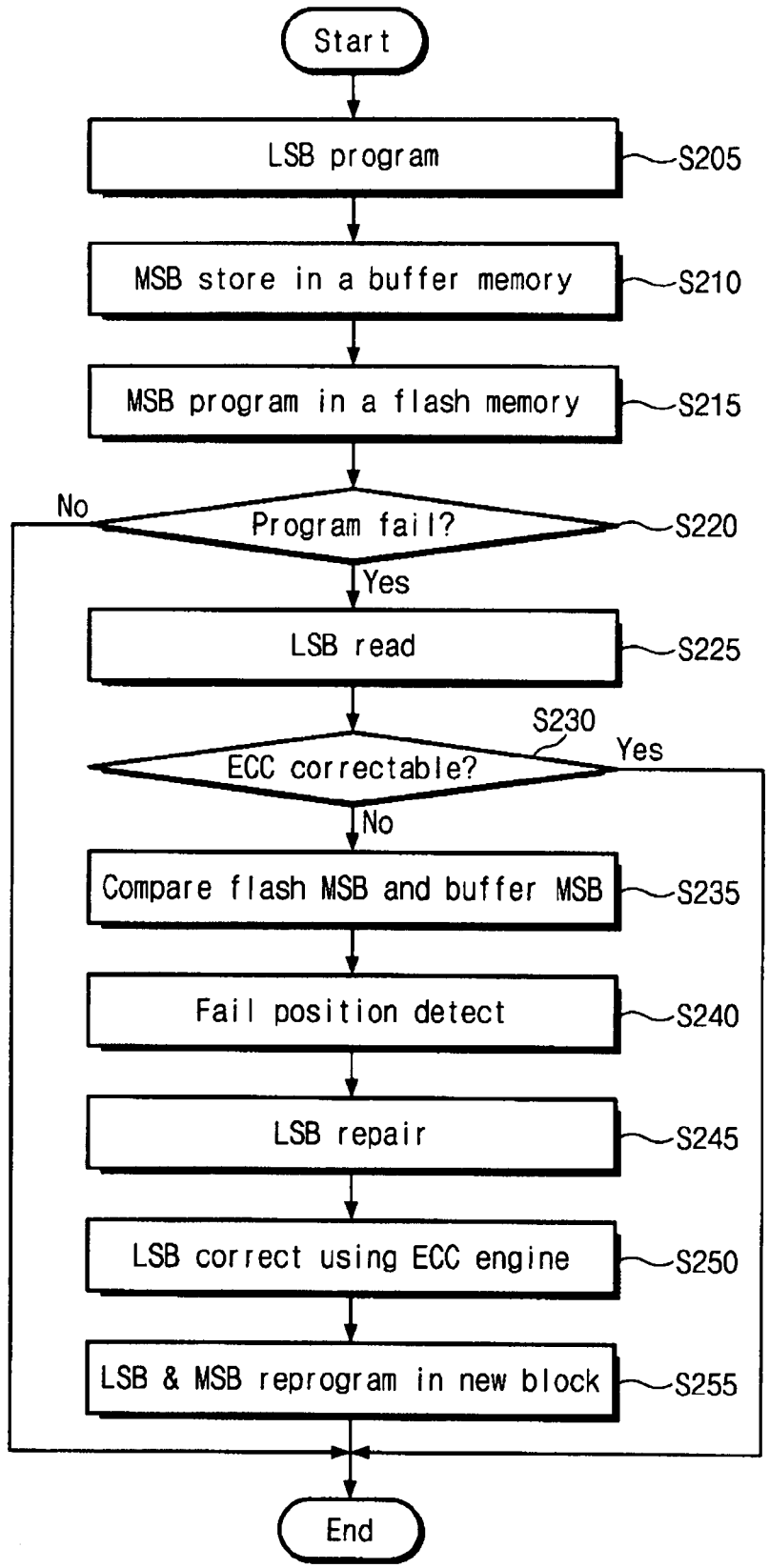
FIG. 13 is a flow chart illustrating a method of programming the memory system of FIG. 10 according to one embodiment of the invention.

An exemplary recovery process for the LSB data is illustrated in FIGS. 12 and 13. However, before explaining the recovery process, it should be noted that the nature of programming errors or malfunctions occurring during MSB or LSB program operations of the selected memory cell typically depends on the arrangement of threshold voltage distributions of the selected memory cell and the assignment of logic states to the threshold voltage distributions. For example, due to the assignment of the four threshold voltage distributions in diagram (b) of FIG. 11 to the respective logic states "11", "01", "10", and "00", and the use of the relatively broad intermediate threshold voltage distribution labeled "0" in diagram (a), certain types of program errors or malfunctions of the selected memory cell are more likely to occur than others.

For instance, where the LSB of the selected memory cell has been successfully programmed to logical "1" and the MSB is to be programmed to logical "0", if programming of the MSB fails, the threshold voltage distribution of the selected memory cell is likely to remain within the threshold voltage distribution labeled "11". In such a case, the LSB of the selected memory cell will remain a logical "1", and therefore will not be affected by the failure to correctly program the MSB.

On the other hand, where the LSB of the selected memory cell has been successfully programmed to logical "0" and the MSB is to be programmed to logical "1", if programming of the MSB fails, it is possible that the LSB of the selected memory cell will be undesirably modified from logical "0" to logical "1". In other words, the intended logic state of the selected memory cell may be "10", but the actual logic state of the selected memory cell may end up as "01" after programming of the MSB fails.

One reason why it is possible for the LSB of the selected memory cell to be undesirably modified from logical "0" to logical "1" is that the threshold voltage distribution labeled "0" in diagram (a) is relatively broad compared with other threshold voltage distributions in FIG. 11. For instance, as illustrated by points "A" and "B" in diagram (a) and corresponding points "A'" and "B'" in diagram (b), the threshold voltage distribution labeled "0" in diagram (a) overlaps with the respective threshold voltage distributions labeled "01" and "10" in diagram (b). Because the threshold voltage distribution labeled "0" in diagram (a) overlaps with multiple threshold voltage distributions in diagram (b), where the threshold voltage of the selected memory cell is at point "A" prior to MSB programming, if programming of the MSB fails, the selected memory cell may end up in the threshold voltage distribution labeled "01".

Because the nature of programming errors or malfunctions occurring during MSB or LSB program operations of the selected memory cell typically depends on the arrangement of threshold voltage distributions of the selected memory cell and the assignment of logic states to the threshold voltage distributions, different recovery operations may be used for memory cells having different threshold voltage distributions and corresponding logic states. Accordingly, a variety of modifications could be made to the teaching examples illustrated in FIGS. 11 through 13 without departing from the scope of the invention.

For simplicity of explanation, an arrangement of threshold voltage distributions and corresponding assignments of logic states to the different threshold voltage distributions will be referred to hereafter as a "cell scramble" for a memory cell or group of memory cells. For example, the "cell scramble" of the selected memory cell of FIG. 11 is illustrated by the threshold voltage distributions for the selected memory cell in diagrams (a) and (b). Because errors or malfunctions in programming of the selected memory cell are dependent on the "cell scramble" of the selected memory cell, bit errors in the selected memory cell will be detected in relation to the cell scramble.

In general, where the cell scramble of FIG. 11 is used, if the MSB is intended to be programmed to logic state "1" but instead is programmed to logic state "0", this typically implies that the selected memory cell has a threshold voltage within the threshold voltage distribution labeled "01" where it is intended to have a threshold voltage within the threshold voltage distribution labeled "10". (Alternatively, it is possible that the MSB error could indicate that the selected memory cell is within the threshold voltage distribution labeled "00" when it was intended to be in the threshold voltage distribution labeled "11"; however, such errors are unlikely enough that they can be ignored in typical operation of nonvolatile memory system 400.) Accordingly, the recovery process can compare MSB data programmed in the selected memory cell with corresponding MSB stored in buffer memory 421, and where the MSB of the selected memory cell is logical "0" and the MSB stored in buffer memory 421 is logical "1", the recovery process can determine not only that an error exists in the MSB data stored in the selected memory cell, but also, that an error has occurred in the LSB data stored in the selected memory cell, changing the LSB data from logical "0" to logical "1".

FIG. 12 is a diagram illustrating an example of a recovery process for LSB and MSB data in nonvolatile memory system 400 of FIG. 10. The recovery process of FIG. 12 includes a fail position detection and data restoration operation.

In FIG. 12, line "(a)" illustrates a page of original data to be programmed in selected memory cells of memory cell array 431, line "(b)" illustrates a page of data actually programmed in the selected memory cells of memory cell array 431, line "(c)" illustrates a page of MSB data programmed in the selected memory cells of memory cell array 431 (denoted "flash MSB data"), line "(d)" illustrates a page of MSB data stored in buffer memory 421 (denoted "buffer MSB data"), line "(e)" illustrates a page of LSB data programmed in the selected memory cells of memory cell array 341 (denoted "flash LSB data"), and line "(f)" illustrates a page of LSB data recovered from the flash LSB data using the recovery process (denoted "repaired LSB data").

In FIG. 12, programming errors or malfunctions are indicated by ovals denoting differences between the original data and the data actually programmed in the selected memory cells. In both of the ovals in FIG. 12, the original data is "10" and the programmed data is "01". In other words, the intended states of selected memory cells including bit errors correspond to the threshold voltage distribution labeled "10" in FIG. 11, but the actual states of the selected memory cells including the bit errors correspond to the threshold voltage distribution labeled "01" in FIG. 11. As described above, this particular type of error can be detected by comparing the flash MSB data with the buffer MSB data. Where the flash MSB data for a particular memory cell is logical "0" and the buffer MSB data for the particular memory cell is logical "1", the LSB data in the particular memory cell should be repaired so that it is logical "0".

In nonvolatile memory system 400, the comparison between the flash MSB data and the buffer MSB data is typically performed in comparator 424 under the control of memory controller 420. The location of a "fail position," i.e., a bit error in the can be detected and stored in fail position detector 425 based on the comparison performed by comparator 424. The flash LSB data is typically read from memory cell array 431 into backup memory 422 through error correction circuit 422. Once comparator 424 and fail position detector 424 have identified an error requiring modification of the flash LSB data, repair circuit 426 can repair the flash LSB data using the fail position to produce the repaired LSB data.

FIG. 13 is a flow chart illustrating a programming operation of the memory system of FIG. 10 according to one embodiment of the invention. The flow chart of FIG. 13 further clarifies the recovery operation illustrated in FIG. 12 and also illustrates other procedures involved in programming nonvolatile memory system 400. In the description that follows, exemplary method steps will be denoted by parentheses. In addition, various conventional details have been omitted from the description of the programming operation for simplicity of explanation. For instance, the description does not discuss specific issues related to sending commands and addresses between host 410 and memory controller 420 or sending control signals from controller 420 to flash memory 430. However, those skilled in the art will recognize a wide variety of techniques for operating and controlling nonvolatile memory system 400 within the scope of the invention.

Referring to FIG. 13, in a programming operation of nonvolatile memory system 400, LSB data is programmed into selected memory cells in memory cell array 431 (S205). For simplicity of explanation, it will be assumed that the LSB data is successfully programmed into the selected memory cells. Next, MSB data to be programmed in the selected memory cells is stored in buffer memory 421 (S210). Then, the MSB data stored in buffer memory 421 is programmed into the selected memory cells (S215).

After the MSB data stored in buffer memory 421 is programmed into the selected memory cells, a program-verify operation is performed to determine whether all of the selected memory cells have been successfully programmed (S220). Where the program-verify operation determines that all of the selected memory cells have been successfully programmed, the programming operation terminates (See, upper arrow labeled "No" in FIG. 13). Where the MSB data is successfully programmed, a flag cell corresponding to the selected memory cells is typically programmed to indicate that MSB data has been programmed in the selected memory cells. Otherwise, where the program-verify operation determines that an error or malfunction has occurred when programming the MSB data in the selected memory cells, memory controller 420 reads the LSB data programmed into the selected memory cells into error correction unit 423 (S225).

At this point, the LSB data stored in error correction unit 423 may contain errors because any error or malfunction that occurred when programming the MSB data in the selected memory cells may also cause errors in the LSB data, as described above. Accordingly, error correction unit 423 next evaluates the LSB data to detect the presence of errors in the LSB data and/or to determine whether any errors that may exist in the LSB data can be corrected using error correction techniques (S230). Where error correction unit 423 determines that the LSB data does not contain any errors or that any errors in the LSB data can be corrected using error correction techniques, there is no real need to modify or repair the LSB data. Instead, the flag cell corresponding to the selected memory cells may remain in a state indicating that only LSB data has been properly programmed in the selected memory cells and the MSB data can be programmed from buffer memory 421 to a different location in memory cell array 431. Alternatively, the LSB data and the MSB data could be programmed into a different set of memory cells in memory cell array 431. In any case, where the LSB data does not contain any errors or only contains errors that can be readily corrected using error correction techniques employed by error correction unit 423, there is no need to repair the LSB data and therefore steps after step S230 in FIG. 13 can be omitted as indicated by the arrow labeled "Yes" in FIG. 13.

Where the LSB data stored in error correction unit 423 contains errors that cannot be readily corrected using error correction techniques employed by error correction unit 423, the LSB data stored in error correction unit 423 is stored in backup memory 422 and further steps are performed as indicated by a lower arrow labeled "No" in FIG. 13. In particular, comparator 424 receives the MSB data programmed in the selected memory cells (the "flash MSB data") and the MSB data stored in buffer memory 421 (the "buffer MSB data") and compares the flash MSB data with the buffer MSB data (S235). Based on differences between the flash MSB data and the buffer MSB data, fail position detector 425 then detects a location of one or more bit errors in the MSB data (S240). Then, using the location obtained by fail position detector 425, and based on the cell scramble of the selected memory cells, repair circuit 426 modifies the LSB data stored in backup memory 422 (S245). Next, the modified LSB data stored in backup memory 422 is transferred back to error correction unit 423 and error correction unit 423 potentially detects and/or corrects remaining errors in the modified LSB data (S250). Finally, once the LSB data has been modified to correct errors caused by failed programming of the MSB data, the LSB data and the MSB data may be programmed from error correction unit 423 or backup memory 422 and buffer memory 421, respectively, into a new block or pages within flash memory 430 (S255).

Figure 14:
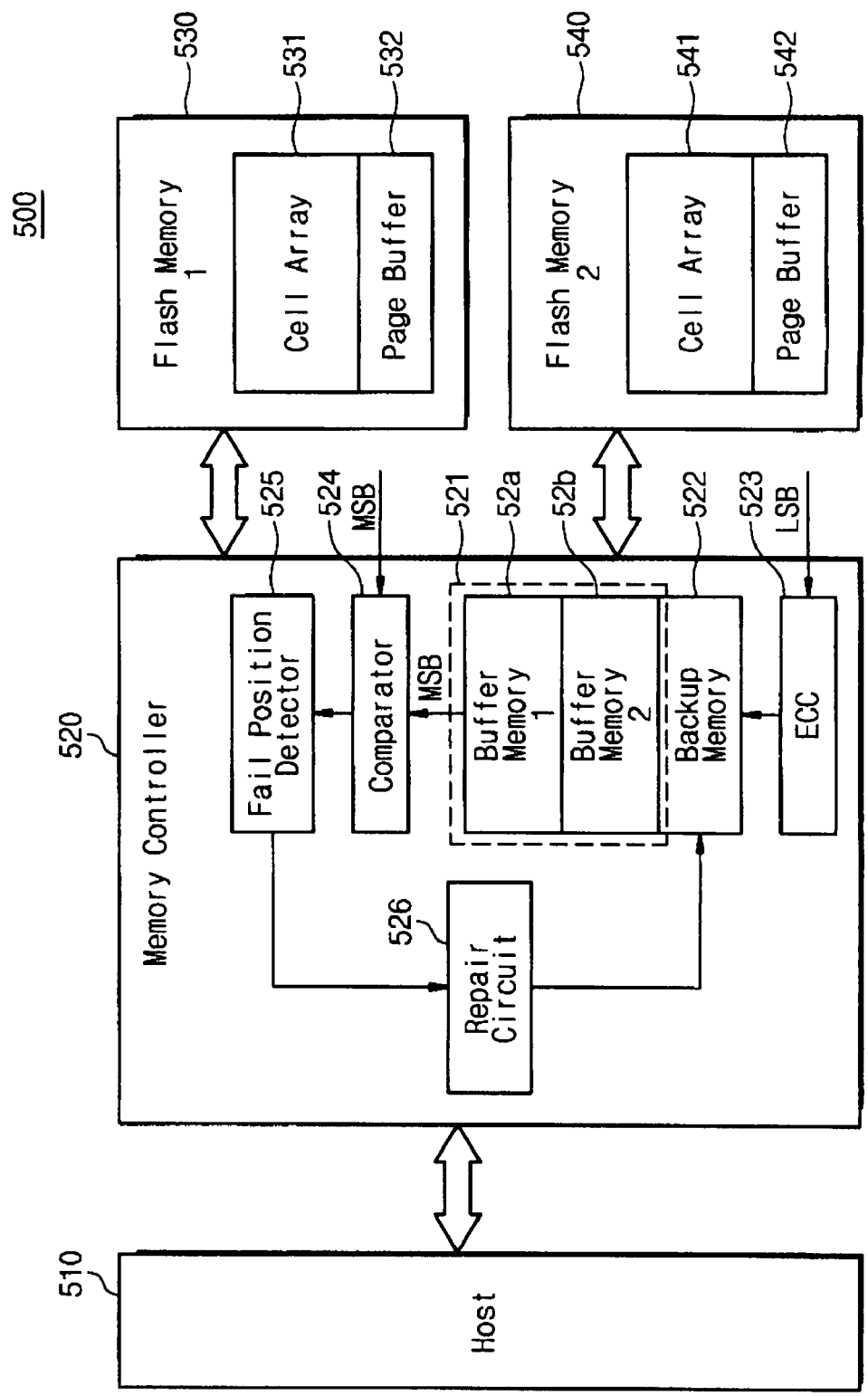
FIG. 14 is a schematic block diagram of a nonvolatile memory system according to yet another embodiment of the invention.

FIG. 14 is a schematic block diagram of a nonvolatile memory system 500 according to yet another embodiment of the invention. Nonvolatile memory system 500 is similar to nonvolatile memory system 400 illustrated in FIG. 10. In particular, nonvolatile memory system 500 comprises a host 510 similar to host 410, a memory controller 520 similar to memory controller 420, and flash memory chips 530 and 540, each similar to flash memory 430.

In contrast to nonvolatile memory system 400, nonvolatile memory system 500 includes two flash memory chips 530 and 540. Accordingly, memory controller 520 includes two buffer memories 52a and 52a used for programming flash memory chip 530 and flash memory chip 540, respectively. However, unlike memory controller 320 in FIG. 8, memory controller 520 only includes one backup memory 522. One reason why memory controller 520 only includes one backup memory 522 is because memory controller 520 operates similar to memory controller 420 in that LSB data programmed in selected memory cells of flash memory chips 530 and 540 is not automatically stored in backup memory 522 before MSB data is programmed in the selected memory cells. On the contrary, the LSB data stored in the selected memory cells is only transferred to backup memory 522 after a failed attempt to program MSB data to the selected memory cells. Where an attempt to program MSB data to selected memory cells in flash memory chip 530 or 540 fails, steps S230 through S255 in FIG. 13 are performed using buffer memory 521 and backup memory 522 to recover LSB data from the selected memory cells.

Figure 15:
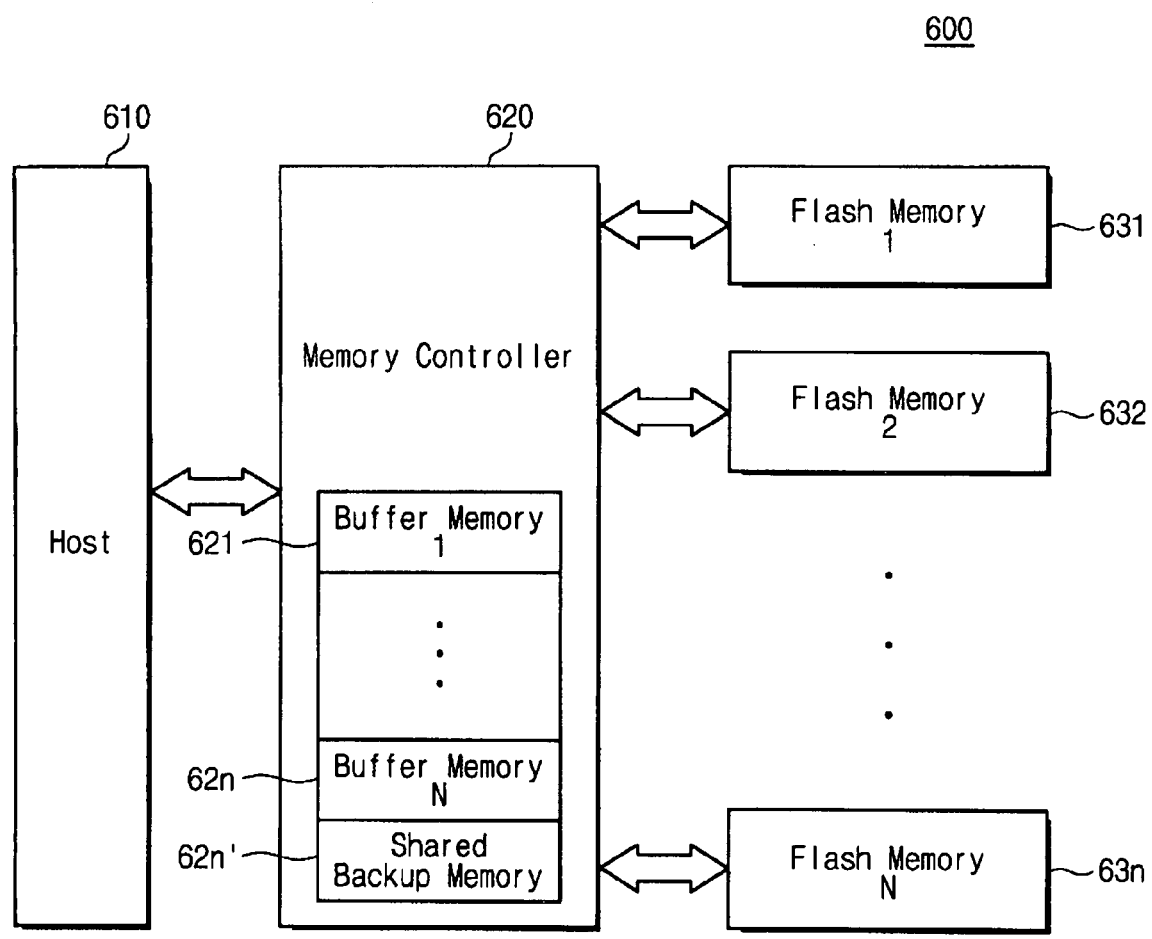
FIG. 15 is a schematic block diagram of a nonvolatile memory system according to yet another embodiment of the invention.

FIG. 15 is a schematic block diagram of a nonvolatile memory system according to yet another embodiment of the invention. Nonvolatile memory system 600 of FIG. 15 is similar to nonvolatile memory system 500 of FIG. 14. In particular, nonvolatile memory system 600 comprises a host 610 similar to host 510, a memory controller 620 similar to memory controller 520, and flash memory chips 631 through 63n, each similar to flash memory chips 530 and 540. However, in contrast to nonvolatile memory system 500, rather than two flash memory chips and two corresponding buffer memories, nonvolatile memory system 600 can have an arbitrary number "n" of buffer memories 621 through 62n and an arbitrary number "n" of corresponding flash memory chips 631 through 63n. Like memory controller 520, memory controller 620 includes a single shared backup memory 62n' used for performing repair operations on LSB data when an operation for programming MSB data in any of flash memory chips 631 through 63n fails. Nonvolatile memory system 600 functions similar to nonvolatile systems 500 and 400, and therefore a highly detailed description of its functionality will be omitted to avoid redundancy.

Like nonvolatile memory systems 300 and 900, nonvolatile memory systems 500 and 600 may use a variety of different interfaces and/or data transfer protocols to transfer data between memory controller 520 and 620 and memory chips 530 and 540 and 631 through 63n, respectively. For example, nonvolatile memory systems 500 and 600 could use multiple interfaces to perform simultaneous parallel data transfers or a one or more interfaces to perform interleaved data transfers. Moreover, like other embodiments of the invention, respective the buffer memories and backup memories in memory controllers 520 and 620 can be formed in various regions of a single chip such as a single DRAM or in multiple different chips.

Because the nonvolatile memory systems illustrated in FIGS. 10 through 15 do not require LSB data to be backed every time MSB programming is performed, these systems will tend to have superior performance relative to systems where LSB data is backed up every time MSB programming is performed, unless programming failures are so frequent that backed-up LSB data must be used with great regularity. In addition, because the systems illustrated in FIGS. 10 through 15 use only one shared backup memory for multiple buffer memories, these systems can be designed to be smaller than similar systems including a backup memory for each buffer memory.

In conclusion, by providing backup memories for data already stored in selected multi-level memory cells, and by providing procedures for recovering data when MSB programming operations fail, embodiments of the invention prevent data from being lost when programming multi-level memory cells. As a result, embodiments of the invention provide nonvolatile memory systems having improved reliability relative to conventional nonvolatile memory systems.

The foregoing exemplary embodiments are teaching examples. Those of ordinary skill in the art will understand that various changes in form and details may be made to the exemplary embodiments without departing from the scope of the invention as defined by the following claims.

What is claimed:

1. A nonvolatile semiconductor memory system, comprising:
   a memory array comprising a plurality of multi-bit memory cells; and,
   a memory controller comprising:
   a buffer memory adapted to store j-bit data programmed in selected memory cells among the plurality of memory cells;
   a repair memory adapted to store i-bit data read from the selected memory cells;
   a fail position detector adapted to determine the location of a bit error in the i-bit data based on a comparison between j-bit data read from the selected memory cells and the j-bit data stored in the buffer memory; and
   a repair unit adapted to repair bit errors in the i-bit data stored in the repair memory.

2. The system of claim 1, wherein the buffer memory has a greater capacity than the repair memory.

3. The system of claim 1, wherein the memory controller further comprises a comparator adapted to perform the comparison.

4. The system of claim 1, wherein the memory controller further comprises an error correction unit adapted to correct errors in the i-bit data.

5. The system of claim 1, wherein the memory controller further comprises an error correction circuit adapted to correct errors in the i-bit data.

6. The system of claim 1, wherein the fail position detector determines the location of the bit error in relation to a cell scramble of the multi-bit memory cells.

7. The system of claim 1, wherein the i-bit data and the j-bit data each comprise a page or a block of data.

8. The system of claim 1, wherein the memory array comprises a NAND flash memory array.

9. A nonvolatile semiconductor memory system, comprising:
   first through n-th memory chips, each comprising a plurality of multi-bit nonvolatile memory cells; and
   a memory controller comprising:
   first through m-th buffer memories each adapted to store j-bit data programmed in selected memory cells among the plurality of multi-bit nonvolatile memory cells in the first through n-th memory chips;
   and first through p-th repair memories adapted to store i-bit data stored in the selected memory cells;
   a fail position detector adapted to determine the location of a bit error in the i-bit data based on a comparison between j-bit data read from the selected memory cells and the j-bit data stored in the buffer memory; and
   a repair unit adapted to repair bit errors in the i-bit data stored in the repair memory.

10. The system of claim 9, wherein n and m are both greater than one and the first through p-th repair memories comprises a single repair memory.

11. The system of claim 9, wherein the first through m-th buffer memories and the first through p-th repair memories comprise different regions of a single memory chip.

12. The system of claim 9, wherein n is equal to m.

13. The system of claim 9, wherein the memory controller further comprises a comparator adapted to perform the comparison.

14. The system of claim 9, wherein the memory controller further comprises an error correction unit adapted to correct errors in the i-bit data.

15. The system of claim 9, wherein the memory controller further comprises an error correction circuit adapted to correct errors in the i-bit data.

16. The system of claim 9, wherein the fail position detector determines the location of the bit error in relation to a cell scramble of the multi-bit memory cells.

17. The system of claim 9, wherein the i-bit data and the j-bit data each comprise a page or a block of data.

18. The system of claim 9, wherein one or more of the first through n-th memory chips comprises a NAND flash memory chip.

19. A method of performing a program operation in a multi-bit nonvolatile semiconductor memory system comprising a memory array including a plurality of multi-bit memory cells, and a memory controller, the method comprising:
   programming i-bit data in selected memory cells of the memory array;
   storing j-bit data in the memory controller;
   programming the j-bit data in the selected memory cells;
   determining whether the j-bit data was successfully programmed in the selected memory cells;
   upon determining that the j-bit data was not successfully programmed in the selected memory cells, comparing the j-bit data stored in the selected memory cells with the j-bit data stored in the memory controller;
   based on the comparison, determining the position of at least one bit error in the i-bit data stored in the selected memory cells; and
   repairing the at least one bit error in the i-bit data.

20. The method of claim 19, further comprising:
   upon determining that the j-bit data was successfully programmed in the selected memory cells, terminating the program operation.

21. The method of claim 19, further comprising:
   upon determining that the j-bit data was not successfully programmed in the selected memory cells and before comparing the j-bit data stored in the selected memory cells with the j-bit data stored in the memory controller, reading the i-bit data from the selected memory cells into the memory controller and determining whether any bit errors in the i-bit data can be corrected by an error correction unit; and upon determining that any errors in the i-bit data can be corrected by the error correction unit, terminating the program operation.

22. The method of claim 19, further comprising:

after repairing the at least one bit error in the i-bit data, correcting any remaining bit errors in the i-bit data using an error correction unit.

23. The method of claim 19, wherein the position of the at least one bit error in the i-bit data is determined in relation to a cell scramble of the multi-bit memory cells.

24. The system of claim 19, wherein one or more of the first through n-th memory chips comprises a NAND flash memory chip.

25. The method of claim 19, wherein the j-bit data and the i-bit data each comprise a page or a block of data.

26. A method of programming a nonvolatile memory comprising multi-bit nonvolatile memory cells, the method comprising:

defining a cell scramble for the memory cells; and upon detecting a programming failure for j-bit data in a selected one of the memory cells, repairing previously programmed i-bit data in the selected memory cell in relation to the cell scramble.

27. The method of claim 26, further comprising:

correcting errors in the i-bit data using an error correction unit.

28. The method of claim 26, wherein the memory cells are two-bit nonvolatile memory cells; and wherein the i-bit data is most significant bit (MSB) data and the j-bit data is least significant bit (LSB) data.

29. The system of claim 26, wherein the memory cells are two-bit nonvolatile memory cells; and wherein the i-bit data is least significant bit (LSB) data and the j-bit data is most significant bit (MSB) data.

30. The method of claim 26, wherein the j-bit data and the i-bit data each comprise a page or a block of data.

31. The method of claim 26, wherein the nonvolatile memory comprises a NAND flash memory.

* * * * *